US012604546B2

(12) United States Patent (10) Patent No.: US 12,604,546 B2
Lee et al. (45) Date of Patent: Apr. 14, 2026

(54) DEPTH SENSOR

(71) Applicant: SAMSUNG ELECTRONICS CO., LTD., Suwon-si (KR)

(72) Inventors: Seung Hyun Lee, Suwon-si (KR); Young Chan Kim, Suwon-si (KR); Young Gu Jin, Suwon-si (KR); Young Sun Oh, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 18/480,479

(22) Filed: Oct. 3, 2023

(65) Prior Publication Data

US 2024/0128290 A1 Apr. 18, 2024

(30) Foreign Application Priority Data

Oct. 17, 2022 (KR) ......................... 10-2022-0133261
Nov. 24, 2022 (KR) ......................... 10-2022-0159304

(51) Int. Cl.
| | |
|---|---|
| *H10F 39/00* | (2025.01) |
| *G01S 7/481* | (2006.01) |
| *H10F 39/18* | (2025.01) |

(52) U.S. Cl.
CPC ...... *H10F 39/80373* (2025.01); *G01S 7/4816* (2013.01); *H10F 39/182* (2025.01); *H10F 39/8063* (2025.01)

(58) Field of Classification Search
CPC ........... H10F 39/80373; H10F 39/8033; H10F 39/182; H10F 39/803; H10F 39/806; H10F 39/802; G01S 7/4914; H04N 25/77
See application file for complete search history.

(56) References Cited

U.S. PATENT DOCUMENTS

| | | | |
|---|---|---|---|
| 9,859,311 | B1 | 1/2018 | Manabe et al. |
| 9,887,217 | B2 | 2/2018 | Ahn et al. |
| 9,966,407 | B2 | 5/2018 | Kim et al. |
| 10,529,761 | B2 | 1/2020 | Tsao et al. |
| 10,741,593 | B1 | 8/2020 | Mabuchi et al. |

(Continued)

FOREIGN PATENT DOCUMENTS

| | | |
|---|---|---|
| WO | WO21033556 A1 | 2/2021 |
| WO | WO21171798 A1 | 9/2021 |

*Primary Examiner* — Sonya McCall-Shepard

(74) *Attorney, Agent, or Firm* — MORGAN, LEWIS & BOCKIUS LLP

(57) ABSTRACT

A depth sensor includes a substrate that includes a first face and a second face opposite to each other in a first direction; a photoelectric conversion element disposed in the substrate; and first and second taps connected to the photoelectric conversion element. Each of the first and second taps includes: a floating diffusion area disposed in the substrate; a transfer transistor connected to the floating diffusion area; a photo transistor connected to the photoelectric conversion element; a tap transfer transistor connected to the photo transistor; and a storage transistor connected to the tap transfer transistor and the transfer transistor. The storage transistor includes a storage gate electrode. The storage gate electrode includes a first extension and a second extension that extend from the first face of the substrate toward the second face, and the first extension and the second extension are spaced apart from each other in a second direction.

20 Claims, 16 Drawing Sheets

(56)　　　　　References Cited

U.S. PATENT DOCUMENTS

| | | | |
|---|---|---|---|
| 2016/0049429 A1 | 2/2016 | Lee et al. | |
| 2019/0057970 A1* | 2/2019 | Sun | H10B 41/10 |
| 2020/0185439 A1* | 6/2020 | Jin | G01S 17/08 |
| 2021/0066362 A1* | 3/2021 | Lee | H10F 39/803 |
| 2021/0199781 A1* | 7/2021 | Jin | G01S 17/18 |
| 2021/0210534 A1 | 7/2021 | Chen et al. | |

\* cited by examiner

<u>1</u>

DEPTH SENSOR

CROSS-REFERENCE TO RELATED APPLICATION

This application claims priority under 35 U.S.C. 119 from Korean Patent Application No. 10-2022-0133261, filed on Oct. 17, 2022 in the Korean Intellectual Property Office, and Korean Patent Application No. 10-2022-0159304, filed on Nov. 24, 2022 in the Korean Intellectual Property Office, the contents of both of which are herein incorporated by reference in their entireties.

TECHNICAL FIELD

Embodiments of the present disclosure are directed to a depth sensor.

DISCUSSION OF THE RELATED ART

An electronic device typically includes sensors that perform various functions, such as calculating a distance between the image sensor and an object or recognizing an object using the captured image, in addition to an image sensor that captures an external image for simple display thereof. Each electronic device that includes a smart phone also includes a depth sensor.

A light signal is emitted from a light source to an object and the light signal may be reflected from the object. A ToF (time of flight)-based depth sensor calculates a distance between the depth sensor and the object based on the reflected light signal. To increase a resolution of the depth sensor, a size of each pixel of the depth sensor is decreased.

SUMMARY

Embodiments of the present disclosure provide a depth sensor with a reduced pixel size, an increased charge storage capacity, and a reduced parasitic light sensitivity (PLS).

According to an embodiment of the present disclosure, there is provided a depth sensor that includes a substrate that includes a first face and a second face that are opposite to each other in a first direction; a photoelectric conversion element disposed in the substrate; and first and second taps connected to the photoelectric conversion element. Each of the first and second taps includes: a floating diffusion area disposed in the substrate; a transfer transistor connected to the floating diffusion area; a photo transistor connected to the photoelectric conversion element; a tap transfer transistor connected to the photo transistor; and a storage transistor connected to the tap transfer transistor and the transfer transistor. The storage transistor includes a storage gate electrode, and the storage gate electrode includes a first extension and a second extension that extend from the first face of the substrate toward the second face thereof. The first extension and the second extension are spaced apart from each other in a second direction that differs from the first direction.

According to an embodiment of the present disclosure, there is provided a depth sensor that includes a substrate and a plurality of pixels disposed on the substrate. Each of the plurality of pixels includes: a photoelectric conversion element; a first photo transistor connected to the photoelectric conversion element by a first photo gate signal; a second photo transistor connected to the photoelectric conversion element by a second photo gate signal; a first floating diffusion area; a second floating diffusion area; a first storage transistor that connects the first photo transistor and the first floating diffusion area to each other; and a second storage transistor that connects the second photo transistor and the second floating diffusion area to each other. The second photo gate signal has a phase that differs from a phase of the first photo gate signal. Each of the first and second storage transistors includes a storage gate electrode, and the storage gate electrode includes a first extension and a second extension that are disposed in the substrate and are spaced apart from each other.

According to an embodiment of the present disclosure, there is provided a depth sensor that includes a substrate that includes a first face and a second face that are opposite to each other in a first direction; and a plurality of pixels disposed on the substrate. Each of the plurality of pixels includes: a photoelectric conversion element disposed in the substrate; and first and second taps that share the photoelectric conversion element. Each of the first and second taps includes: a floating diffusion area disposed in the substrate; a transfer transistor connected to the floating diffusion area; a photo transistor connected to the photoelectric conversion element; a tap transfer transistor connected to the photo transistor; a storage transistor connected to the tap transfer transistor and the transfer transistor; and a barrier area disposed in the substrate and that overlaps the storage transistor in the first direction. Aa first photo gate signal applied to the photo transistor of the first tap and a second photo gate signal applied to the photo transistor of the second tap have phases that differ from each other. The storage transistor includes a storage gate electrode that includes a first extension and a second extension, where the first extension and the second extension extend from the first face of the substrate toward the second face thereof and are spaced apart from each other in a second direction that differs from the first direction.

DETAILED DESCRIPTION

Figure 1:
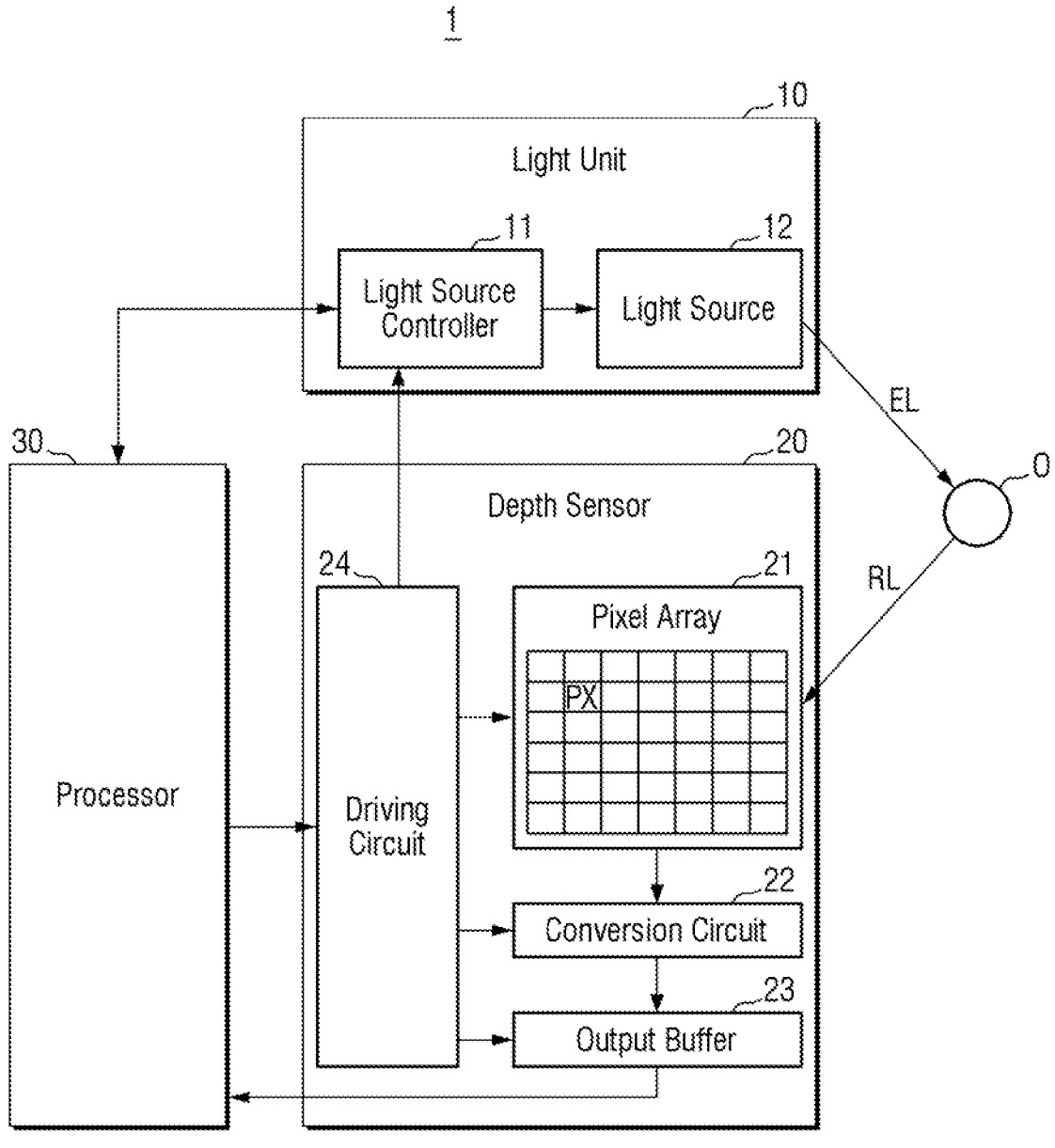
FIG. 1 is a block diagram of an image sensing system according to some embodiments.

FIG. 1 is a block diagram that illustrates an image sensing system according to some embodiments.

Referring to FIG. 1, in an embodiment, an image sensing system 1 includes a light unit 10, a depth sensor 20, and a processor 30. The image sensing system 1 can be implemented in any of various electronic devices, such as a digital camera, a smart phone, a tablet PC, and a wearable device. Further, the image sensing system 1 can be implemented as any of various systems used for recognition of surroundings, such as an autonomous driving system. The image sensing system 1 can be implemented as any device or circuit that measures a depth of an object. For example, the image sensing system 1 can be embodied as one of an integrated circuit (IC), a system on chip (SoC), etc.

The light unit 10 includes a light source controller 11 and a light source 12. The light source controller 11 controls the light source 12 under control of the depth sensor 20 or the processor 30. The light source controller 11 modulates a light signal EL emitted or output from the light source 12. The light source 12 emits the light signal EL modulated by the light source controller 11. For example, the modulated light signal EL may have a form of a pulse wave or a sinusoidal wave, and the light signal EL may be infrared light, microwave radiation, or visible light. The light source 12 includes, for example, at least one of an LED (light emitting diode), an LD (laser diode), or an OLED (organic LED).

The depth sensor 20 detects a light signal RL reflected from an object O. The depth sensor 20 detects a distance between the object O and the image sensing system 1 based on the reflected light signal RL. The depth sensor 20 includes a pixel array 21, a conversion circuit 22, an output buffer 23, and a driving circuit 24. The depth sensor 20 may be referred to as a TOF (time of flight) sensor.

Figure 2:
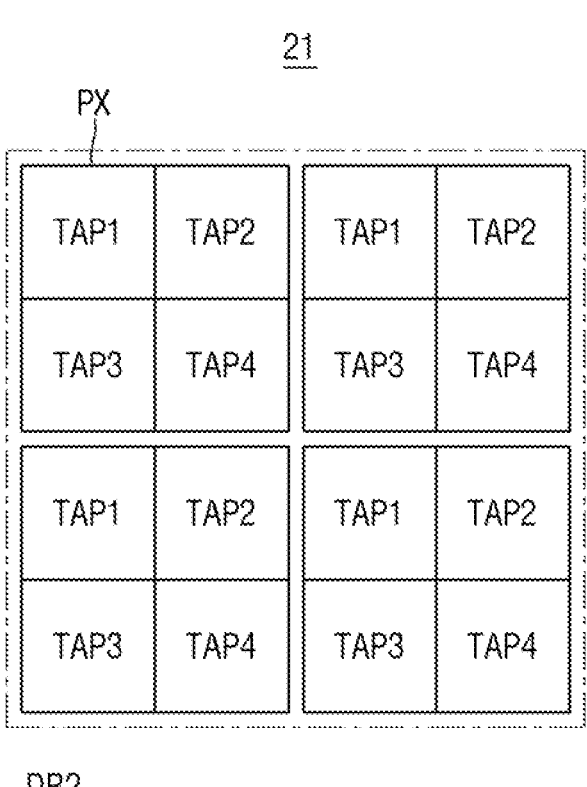
FIG. 2 illustrates a pixel array according to some embodiments.

The pixel array 21 includes a plurality of pixels PX arranged in two dimensions, such as each of a first direction DR1 and a second direction DR2 of FIG. 2. Each pixel PX generates an analog signal based on the light signal RL reflected from the object O. The analog signal includes pixel signals that correspond to each of the pixels PX. Due to a distance between the image sensing system 1 and the object O, a time at which the light signal RL is incident to the pixel array 21 is later than a time at which the light signal EL output from the light source 12 is directly incident to the pixel array 21. Therefore, a difference between a time at which the light signal RL is incident to the pixel array 21 and a time at which the light signal EL is directly incident to the pixel array 21 occurs. The distance between the object O and the image sensing system 1 can be calculated based on the difference. The pixel array 21 is controlled based on drive signals, such as various signals PS1, PS2, PS3, PS4, T1, T2, T3, T4, SS1, SS2, SS3, SS4, TS1, TS2, TS3, TS4, RS1, RS2, RS3, RS4, SE1, SE2, SE3, SE4, OF of FIG. 3, received from the driving circuit 24.

The conversion circuit 22 converts an analog signal generated by the pixel array 21 into a digital signal. The conversion circuit 22 performs various operations that convert the analog signal into the digital signal based on the control signals received from the driving circuit 24. For example, the conversion circuit 22 performs a correlated double sampling (CDS) operation on the analog signal, and removes noise from the analog signal. The conversion circuit 22 constructs depth data using the digital signal. The depth data may be referred to as distance data.

The output buffer 23 stores the depth data generated by the conversion circuit 22. The output buffer 23 outputs the digital signal to the processor 30.

The driving circuit 24 controls the pixel array 21, the conversion circuit 22, and the output buffer 23. For example, the driving circuit 24 generates a clock signal and a timing control signal that operate each of the pixel array 21, the conversion circuit 22, and the output buffer 23. The clock signal and the timing control signal are provided to the light source controller 11.

The processor 30 controls the image sensing system 1 and calculates various data. The processor 30 controls the light unit 10 so that the light source 12 outputs the light signal EL. The processor 30 controls the depth sensor 20 to sense the light signal RL reflected from the object O and to generate the depth data based on the sensed light signal RL. The processor 30 includes an image signal processor that processes the depth data received from the output buffer 23. The image signal processor calculates the distance, which is a TOF (Time of Flight) value, between the object O and the image sensing system 1 based on the depth data. For example, the processor 30 calculates a difference between a time at which the output light signal EL is directly incident to the pixel array 21 and a time at which the reflected light signal RL is incident thereto, based on the depth data, and calculates the TOF value based on the difference. The processor 30 determines a distance to the object, a shape thereof, and a movement speed thereof, based on the TOF value. In an embodiment, the processor 30 is disposed within the depth sensor 20.

Figure 3:
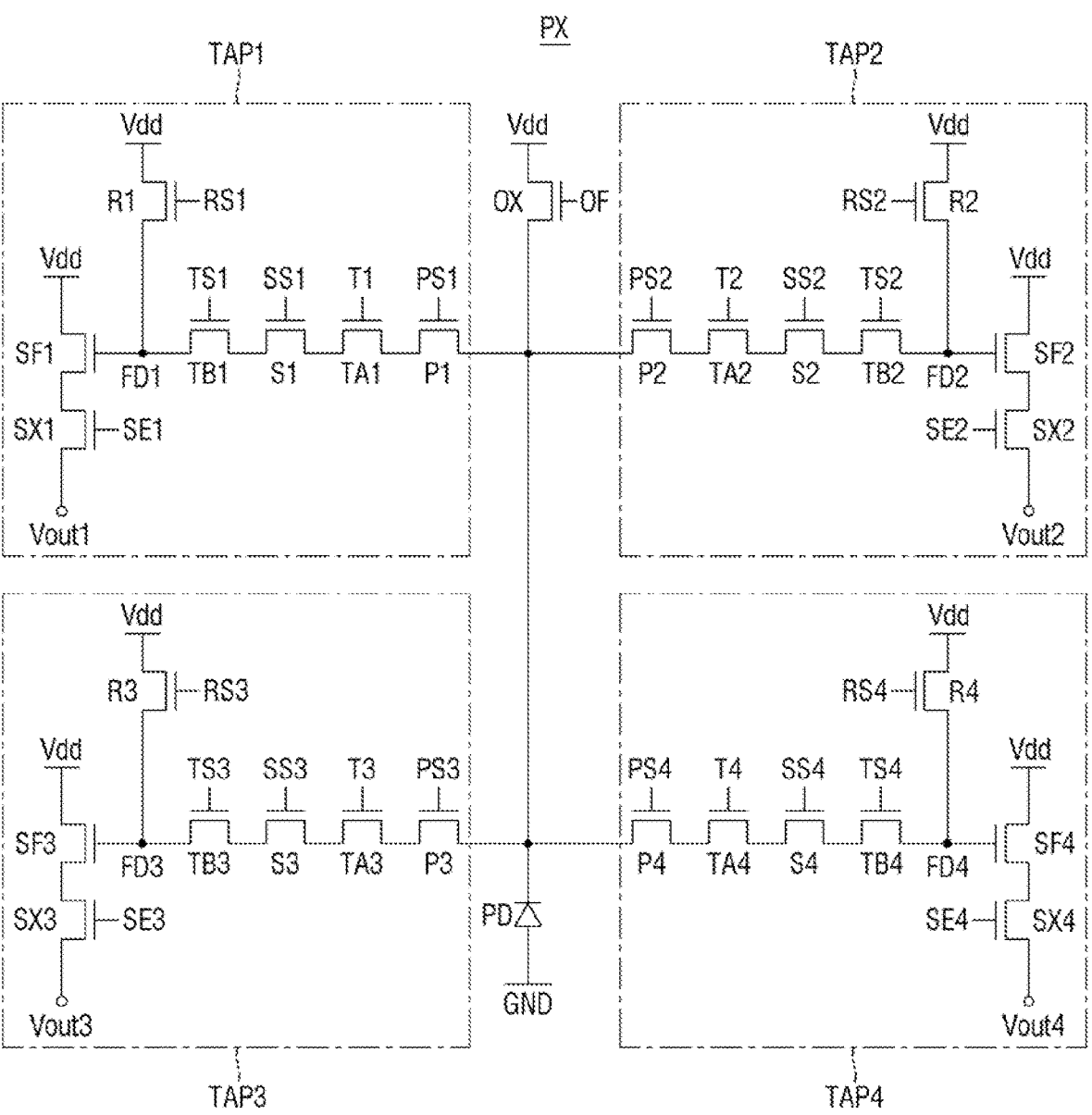
FIG. 3 is a circuit diagram of a pixel according to some embodiments.

FIG. 2 illustrates a pixel array according to some embodiments. FIG. 3 is a circuit diagram of a pixel according to some embodiments.

Referring to FIGS. 2 and 3, the pixel array 21 includes a plurality of pixels PX. The plurality of pixels PX are two-dimensionally arranged, such as in a matrix, in a plane that is parallel to the first direction DR1 and the second direction DR2.

The pixel PX has a 4-tap structure. The pixel PX includes a photoelectric conversion element PD, a first tap TAP1, a second tap TAP2, a third tap TAP3, a fourth tap TAP4, and an overflow transistor OX. The first to fourth taps TAP1, TAP2, TAP3, and TAP4 surround the photoelectric conversion element PD. The first to fourth taps TAP1, TAP2, TAP3, and TAP4 are connected to one photoelectric conversion element PD. The first to fourth taps TAP1, TAP2, TAP3, and TAP4 share the photoelectric conversion element PD.

Each of the first to fourth taps TAP1, TAP2, TAP3, and TAP4 includes first to fourth photo transistors P1, P2, P3, and P4, respectively, first to fourth tap transfer transistors TA1, TA2, TA3, and TA4, respectively, first to fourth storage transistors S1, S2, S3, and S4, respectively, first to fourth transfer transistors TB1, TB2, TB3, and TB4, respectively, first to fourth reset transistors R1, R2, R3, and R4, respectively, first to fourth source follower transistors SF1, SF2, SF3, and SF4, respectively, and first to fourth select transistors SX1, SX2, SX3, and SX4, respectively.

The photoelectric conversion element PD generates and accumulates charge based on the light signal RL. The photoelectric conversion element PD is connected to and disposed between one end of each of the first to fourth photo transistors P1, P2, P3, and P4 and a power voltage GND. The charge from the photoelectric conversion element PD is distributed to the first to fourth photo transistors P1, P2, P3, and P4. An amount of charge stored in each of the first to fourth photo transistors P1, P2, P3, and P4 can be determined based on a difference between a phase of each of first to fourth photo gate signals PS1, PS2, PS3, and PS4 and a phase of the light signal EL. For example, one or more of a photodiode, a photo transistor, a photo gate, a pinned photodiode, or a combination thereof can be used as the photoelectric conversion element PD.

One end, such as a drain or a source, of each of the first to fourth photo transistors P1, P2, P3 and P4 is connected to the photoelectric conversion element PD. Each of the first to fourth photo transistors P1, P2, P3, and P4 receives the charge generated by the photoelectric conversion element PD based on each of the first to fourth photo gate signals PS1, PS2, PS3, and PS4, and accumulates the received charge. The charge is generated based on the light signal RL. The first to fourth photo gate signals PS1, PS2, PS3, and PS4 are activated (or enabled) during an exposure period during which the light signal EL is emitted and the light signal RL is incident to the pixel PX, and are deactivated (or disabled) for a period other than the exposure period.

The first to fourth tap transfer transistors TA1, TA2, TA3, and TA4 are disposed between and connected to the first to fourth storage transistors S1, S2, S3, and S4, respectively, and the first to fourth photo transistors P1, P2, P3, and P4, respectively. The first to fourth tap transfer transistors TA1, TA2, TA3, and TA4 transfer charge respectively accumulated by the first to fourth tap transfer transistors TA1, TA2, TA3, and TA4 during the exposure period to the first to fourth storage transistors S1, S2, S3, and S4, respectively, based on each of the first to fourth tap transfer gate signals T1, T2, T3, and T4, respectively. The charge accumulated by each of the first to fourth tap transfer transistors TA1, TA2, TA3, and TA4 during a period other than the exposure period is prevented from being transferred to each of the first to fourth storage transistors S1, S2, S3, and S4.

The first to fourth storage transistors S1, S2, S3, and S4 are disposed between and connected to each the first to fourth tap transfer transistors TA1, TA2, TA3, and TA4, respectively, and the first to fourth transfer transistors TB1, TB2, TB3, and TB4, respectively. The first to fourth storage transistors S1, S2, S3, and S4 store the charge accumulated by the first to fourth photo transistors P1, P2, P3, and P4, respectively, based on the first to fourth storage gate signals SS1, SS2, SS3, and SS4, respectively. For example, the charge accumulated by the first to fourth photo transistors P1, P2, P3, and P4 is not immediately transferred to first to fourth floating diffusion areas FD1, FD2, FD3, and FD4, respectively.

The first to fourth transfer transistors TB1, TB2, TB3, and TB4 are disposed between and connected to the first to fourth storage transistors S1, S2, S3, and S4, respectively, and the first to fourth floating diffusion areas FD1, FD2, FD3, and FD4, respectively. The first to fourth transfer transistors TB1, TB2, TB3, and TB4 transfer the charge stored in the first to fourth storage transistors S1, S2, S3, and S4, respectively, to the first to fourth floating diffusion areas FD1, FD2, FD3, and FD4, respectively, based on the first to fourth transfer gate signals TS1, TS2, TS3, and TS4, respectively.

The first to fourth reset transistors R1, R2, R3, and R4 are respectively connected to and disposed between the first to fourth floating diffusion areas FD1, FD2, FD3, and FD4 and a power voltage Vdd. The first to fourth reset transistors R1, R2, R3, and R4 respectively connect the first to fourth floating diffusion areas FD1, FD2, FD3, and FD4 to the power voltage Vdd, based on the first to fourth reset gate signals RS1, RS2, RS3, and RS4, respectively, such that the charge stored in the first to fourth floating diffusion areas FD1, FD2, FD3, and FD4, respectively, can be removed or discharged, and the first to fourth floating diffusion areas FD1, FD2, FD3, and FD4 can be reset.

Figure 5:
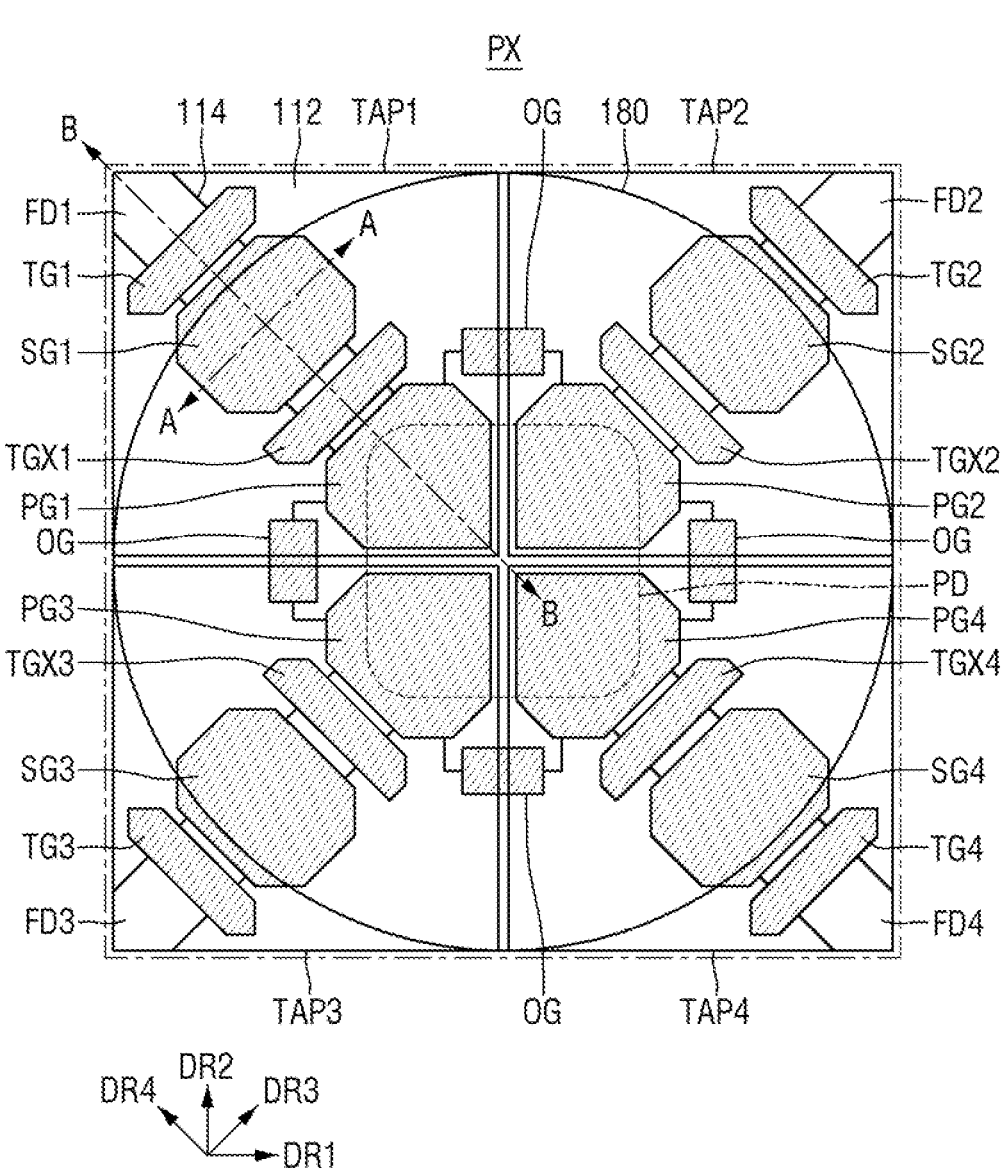
FIG. 5 illustrates a pixel according to some embodiments.

The first to fourth taps TAP1, TAP2, TAP3, and TAP4 respectively include first to fourth tap transfer gate electrodes TGX1, TGX2, TGX3, and TGX4 (see FIG. 5). The first to fourth tap transfer transistors TA1, TA2, TA3, and TA4 are respectively connected to the first to fourth storage transistors S1, S2, S3, and S4.

A gate of the first to fourth source follower transistors SF1, SF2, SF3, and SF4 is connected to the first to fourth floating diffusion areas FD1, FD2, FD3, and FD4, respectively. The first to fourth source follower transistors SF1, SF2, SF3, and SF4 respectively output first to fourth output signals Vout1, Vout2, Vout3, and Vout4, based on a voltage level of each of the first to fourth floating diffusion areas FD1, FD2, FD3, and FD4, respectively.

The first to fourth select transistors SX1, SX2, SX3, and SX4 are connected to and disposed between the first to fourth source follower transistors SF1, SF2, SF3, and SF4, respectively, and an output line. The first to fourth select transistors SX1, SX2, SX3, and SX4 output the first to fourth output signals Vout1, Vout2, Vout3, and Vout4, respectively, based on the first to fourth select signals SE1, SE2, SE3, and SE4, respectively. For example, differences between the voltage levels of the first to fourth output signals Vout1, Vout2, Vout3, and Vout4 represent a distance between the object O and the sensing system 1.

An overflow transistor OX is connected to and disposed between the power voltage Vdd and the photoelectric conversion element PD. Due to external light during a time period other than the exposure period, the photoelectric conversion element PD or the first to fourth photo transistors P1, P2, P3, and P4 accumulate charge. The overflow transistor OX removes the charge accumulated by the photoelectric conversion element PD and each of the first to fourth photo transistors P1, P2, P3, and P4 during the time period other than the exposure period, or discharges the accumulated charge to the power voltage Vdd, based on the overflow gate signal OF. In an embodiment, each of the first to fourth taps TAP1, TAP2, TAP3, and TAP4 includes the overflow transistor OX. In an embodiment, the first to fourth taps TAP1, TAP2, TAP3, and TAP4 share the overflow transistor OX.

In an embodiment, each of the transistors P1, P2, P3, P4, TA1, TA2, TA3, TA4, S1, S2, S3, S4, TB1, TB2, TB3, TB4, R1, R2, R3, R4, SF1, SF2, SF3, SF4, SX1, SX2, SX3, SX4, and OX in the pixel PX is embodied as a NMOS transistor. In embodiments, each of the transistors P1, P2, P3, P4, TA1, TA2, TA3, TA4, S1, S2, S3, S4, TB1, TB2, TB3, TB4, R1, R2, R3, R4, SF1, SF2, SF3, SF4, SX1, SX2, SX3, SX4, and OX in the pixel PX is embodied as a PMOS transistor or a combination of an NMOS transistor and a PMOS transistor.

Figure 4:
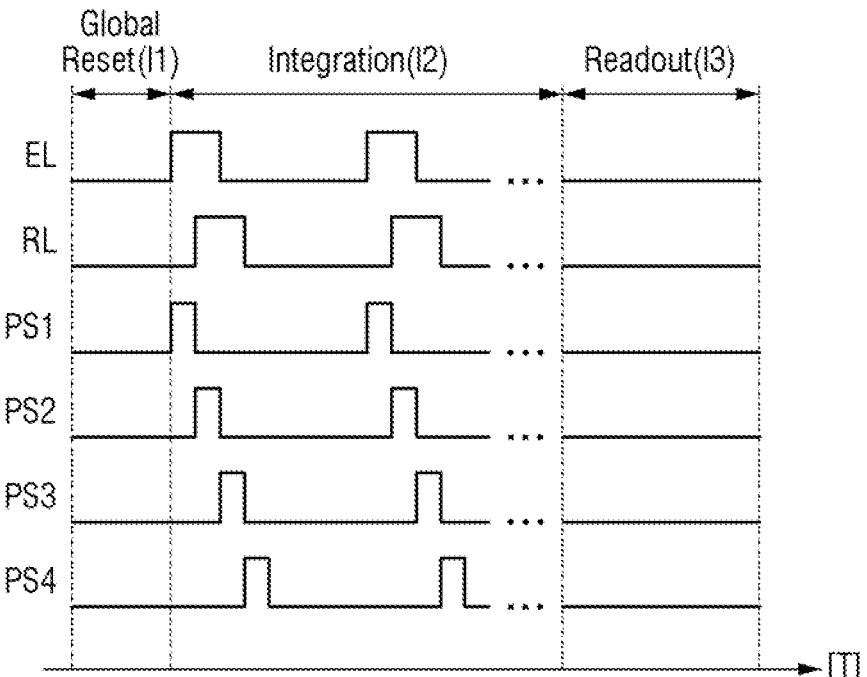
FIG. 4 is a timing diagram of an operation of a depth sensor according to some embodiments.

FIG. 4 is a timing diagram of an operation of a depth sensor according to some embodiments.

Referring to FIG. 1, FIG. 3, and FIG. 4, in an embodiment, a period for reading one frame includes a global reset period I1, an integration period I2, and a read-out period I3, and the period is repeated.

In the global reset period I1, the pixel PX is reset. The first to fourth floating diffusion areas FD1, FD2, FD3, and FD4 are reset. No light signal EL is emitted, and no light signal RL is incident to the pixel PX.

In the integration period I2, the light signal EL is emitted to the object O, and the light signal RL is incident to the pixel PX. Each of the first to fourth photo transistors P1, P2, P3, and P4 accumulates the charges, based on each of the first to fourth photo gate signals PS1, PS2, PS3, and PS4. The charges accumulated by the first to fourth photo transistors P1, P2, P3, and P4 flow through the first to fourth tap transfer transistors TA1, TA2, TA3, and TA4 and are then stored in the first to fourth storage transistors S1, S2, S3, and S4.

The first to fourth photo gate signals PS1, PS2, PS3, and PS4 have different phases. The first to fourth photo gate signals PS1, PS2, PS3, and PS4 have high levels at different times. The first to fourth photo gate signals PS1, PS2, PS3, and PS4 do not temporally overlap each other. For example, the first photo gate signal PS1 has the same phase as the light signal EL, and the second photo gate signal PS2 has a phase that differs by 90 degrees from that of the light signal EL. The third photo gate signal PS3 has a phase that differs by 180 degrees from that of the light signal EL, and the fourth gate photo signal PS4 has a phase that differs by 270 degrees from that of the light signal EL.

The pixels PX are arranged in rows. In the read-out period I3, a read-out operation is performed on a row of pixels. No light signal EL is emitted to the object O and the light source 12 (see FIG. 1) is inactive. In the read-out period I3, the charges stored in the first to fourth storage transistors S1, S2, S3, and S4 are transferred to the first to fourth floating diffusion areas FD1, FD2, FD3, and FD4, respectively, and are output based on the first to fourth select signals SE1, SE2, SE3, and SE4, respectively.

Figure 6:
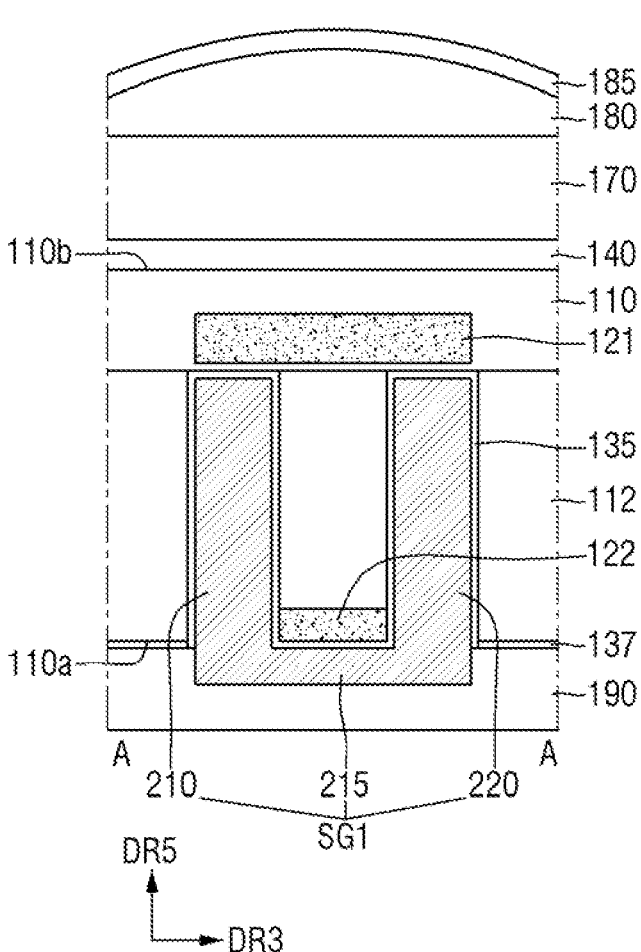
FIG. 6 is a cross-sectional view taken along line A-A in FIG. 5.
Figure 7:
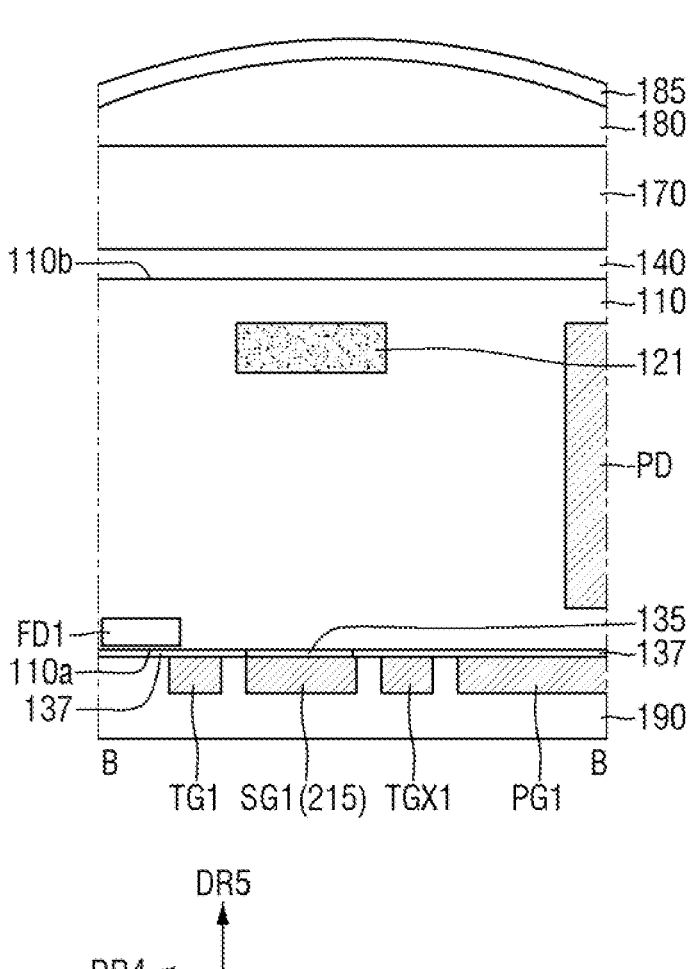
FIG. 7 is a cross-sectional view taken along line B-B of FIG. 5.

FIG. 5 illustrates a pixel according to some embodiments. FIG. 6 is a cross-sectional view taken along line A-A in FIG. 5. FIG. 7 is a cross-sectional view taken along line B-B of FIG. 5.

Referring to FIG. 3 and FIG. 5 to FIG. 7, in a depth sensor according to some embodiments, the pixel PX includes the photoelectric conversion element PD, the first to fourth taps TAP1, TAP2, TAP3, and TAP4, and a micro lens 180.

The first to fourth photo transistors P1, P2, P3, and P4 respectively include first to fourth photo gate electrodes PG1, PG2, PG3, and PG4. The first to fourth tap transfer transistors TA1, TA2, TA3, and TA4 respectively include the first to fourth tap transfer gate electrode TGX1, TGX2, TGX3, and TGX4. The first to fourth storage transistors S1, S2, S3, and S4 respectively include first to fourth storage gate electrodes SG1, SG2, SG3, and SG4. The first to fourth transfer transistors TB1, TB2, TB3, and TB4 respectively include first to fourth transfer gate electrodes TG1, TG2, TG3, and TG4. The overflow transistor OX includes an overflow gate electrode OG.

The first to fourth photo gate electrodes PG1, PG2, PG3, and PG4 are arranged around the photoelectric conversion element PD. The first to fourth photo gate electrodes PG1, PG2, PG3, and PG4 surround the photoelectric conversion element PD. In a plan view, the first to fourth photo gate electrodes PG1, PG2, PG3, and PG4 overlap the photoelectric conversion element PD. For example, the photoelectric conversion element PD is disposed at a center of the pixel PX in a plan view.

For example, the second tap TAP2 and the first tap TAP1 are symmetric in the first direction DR1. The third tap TAP3 and the first tap TAP1 are symmetric in the second direction DR2. The fourth tap TAP4 is symmetric with the second tap TAP2 in the second direction DR2 and the fourth tap TAP4 is symmetric with the third tap TAP3 in the first direction DR1.

For example, the first photo gate electrode PG1, the first tap transfer gate electrode TGX1, the first storage gate electrode SG1, the first transfer gate electrode TG1 and the first floating diffusion area FD1 are sequentially arranged along a fourth direction DR4. For example, the first floating diffusion area FD1 is adjacent to a vertex of the first tap TAP1. For example, the first floating diffusion area FD1 is disposed between respective first to fourth taps TAP1, TAP2, TAP3, and TAP4 of four different pixels PX. The respective first to fourth taps TAP1, TAP2, TAP3, and TAP4 of the four different pixels PX share the first floating diffusion area FD1.

Each of the first to fourth directions DR1, DR2, DR3, and DR4 is parallel to a first face 110$a$ or a second face 110$b$ of a substrate 110. For example, the first direction DR1 and the second direction DR2 are perpendicular to each other. The third direction DR3 is between the first direction DR1 and the second direction DR2. The fourth direction DR4 is symmetric with the third direction DR3 around the second direction DR2. The fourth direction DR4 and the third direction DR3 are perpendicular to each other. A fifth direction DR5 is perpendicular to the second face 110$b$ of the substrate 110. The fifth direction DR5 is perpendicular to the first to fourth directions DR1, DR2, DR3, and DR4.

A depth sensor according to some embodiments includes the substrate 110, an element isolation film 112, the photoelectric conversion element PD, the first to fourth photo gate electrodes PG1, PG2, PG3, and PG4, the first to fourth tap transfer gate electrodes TGX1, TGX2, TGX3, and TGX4, the first to fourth storage gate electrodes SG1, SG2, SG3, and SG4, the first to fourth transfer gate electrodes TG1, TG2, TG3, and TG4, the first to fourth floating diffusion areas FD1, FD2, FD3, and FD4, a first barrier area 121, a second barrier area 122, a gate dielectric film 135, a gate insulating film 137, a planarization layer 140, a color filter 170, the micro lens 180, a protective film 185, and a wiring structure 190. Hereinafter, the first photo gate electrode PG1, the first tap transfer gate electrode TGX1, the first storage gate electrode SG1, the first transfer gate electrode TG1, and the first floating diffusion area FD1 will be described by way of example. A description of each of the second to fourth photo gate electrodes PG2, PG3, and PG4 is substantially the same as that of the first photo gate electrode PG1. A description of each of the second to fourth tap transfer gate electrodes TGX2, TGX3, and TGX4 is substantially the same as that of the first tap transfer gate electrode TGX1. A description of each of the second to fourth storage gate electrodes SG2, SG3, and SG4 is substantially the same as the description of the first storage gate electrode SG1. A description of each of the second to fourth transfer gate electrodes TG2, TG3, and TG4 is substantially the same as that of the first transfer gate electrode TG1. A description of each of the second to fourth floating diffusion areas FD2, FD3, and FD4 is substantially identical to that of the first floating diffusion area FD1.

The substrate 110 includes the first face 110$a$ and the second face 110$b$ that are opposite to each other. The first face 110$a$ and the second face 110$b$ are opposite to each other in the fifth direction DR5. In the fifth direction DR5, the first face 110$a$ is a bottom face and the second face 110$b$ is a top face. The substrate 110 may be made of bulk silicon or SOI (silicon-on-insulator). The substrate 110 has a first conductivity type. Hereinafter, the first conductivity type is a p-type and a second conductivity type is an n-type. The substrate 110 may have, for example, a structure in which a p-type epitaxial layer is formed on a p-type bulk silicon substrate, or a structure in which only the p-type epitaxial layer remains after the bulk silicon substrate has been removed in a manufacturing process of a depth sensor. In another example, the substrate 110 is a bulk semiconductor substrate that includes a p-type well.

The element isolation film 112 is disposed within the substrate 110. The element isolation film 112 is formed by, for example, filling an insulating material in a shallow trench formed by patterning the substrate 110. The element isolation film 112 extends from the first face 110$a$ of the substrate 110 toward the second face 110*b*. A top face of the element isolation film 112 in the fifth direction DR5 is located within the substrate 110. The element isolation film 112 surrounds an active area 114. The element isolation film 112 defines the active area 114.

The photoelectric conversion element PD, the first photo gate electrode PG1, the first tap transfer gate electrode TGX1, the first storage gate electrode SG1, the first transfer gate electrode TG1, the first floating diffusion area FD1 and the overflow gate electrode OG are disposed on the active area 114. A gate electrode of each of the first to fourth source follower transistor SF1, SF2, SF3, and SF4, a gate electrode of each of the first to fourth select transistors SX1, SX2, SX3, and SX4, and a gate electrode of each of the first to fourth reset transistors R1, R2, R3, and R4 is disposed on the active area 114 defined by the element isolation film 112 in the pixel PX. For example, the gate electrode of each of the first to fourth source follower transistors SF1, SF2, SF3, and SF4, the gate electrode of each of the first to fourth select transistor SX1, SX2, SX3, and SX4, and the gate electrode of each of the first to fourth reset transistors R1, R2, R3, and R4 is disposed on the active area 114 of each of the first to fourth taps TAP1, TAP2, TAP3, and TAP4.

The first storage gate electrode SG1 does not overlap the photoelectric conversion element PD in the fifth direction DR5. In a depth sensor according to some embodiments, the first storage gate electrode SG1 includes a first extension 210, a second extension 220, and a first connection portion 215. For example, referring to FIG. 6, the first storage gate electrode SG1 has a U-shape.

The first extension 210 and the second extension 220 are disposed within the substrate 110. The first extension 210 and the second extension 220 extend from the first face 110*a* of the substrate 110 toward the second face 110*b*. A top face of the first extension 210 and a top face of the second extension 220 in the fifth direction DR5 are positioned within the substrate 110. The first extension 210 and the second extension 220 are spaced apart from each other in, for example, the third direction DR3. The first extension 210 and the second extension 220 extend within the substrate 110 in, for example, the fourth direction DR4. The first extension 210 and the second extension 220 extend in, for example, the fourth direction DR4 in a plan view. A plan view refers to a view toward, for example, a plane defined by the first and second directions DR1 and DR2.

The first connection portion 215 is disposed on the first face 110*a* of the substrate 110. The first connection portion 215 extends along the first face 110*a* of the substrate 110. The first connection portion 215 connects the first extension 210 and the second extension 220 to each other. For example, the first connection portion 215 extends in the third direction DR3 in a plan view.

Although the drawing shows that the depths in the fifth direction DR5 of each of the first extension 210 and the second extension 220 is equal to a depth in the fifth direction DR5 of the element isolation film 112, embodiments of the present disclosure are not necessarily limited thereto. In some embodiments, the depths in the fifth direction DR5 of each of the first extension 210 and the second extension 220 differ from the depth in the fifth direction DR5 of the element isolation film 112.

The first barrier area 121 is disposed within the substrate 110. The first barrier area 121 is spaced apart from the first storage gate electrode SG1 in the fifth direction DR5. The first barrier area 121 overlaps the first storage gate electrode SG1 in the fifth direction DR5. The first barrier area 121 overlaps, for example, the first extension 210 and the second extension 220 in the fifth direction DR5. The first barrier area 121 overlaps, for example, an entirety of the first storage gate electrode SG1 in the fifth direction DR5. The first barrier area 121 prevents a light signal from being provided to the first storage transistor S1, which includes the first storage gate electrode SG1, thereby minimizing an external influence on charge stored in the first storage transistor S1. The first barrier area 121 prevents the first storage transistor S1 from generating charge due to external light.

The first barrier area 121 further overlaps, for example, the first floating diffusion area FD1 or at least a portion of each of the gate electrodes TG1, TGX1, and PG1 in the fifth direction DR5. The first barrier area 121 has, for example, the first conductivity type.

The second barrier area 122 is disposed within the substrate 110. The second barrier area 122 is disposed within the substrate 110 and between the first extension 210 and the second extension 220. The second barrier area 122 is adjacent to the first face 110*a* of the substrate 110. The second barrier area 122 is adjacent to the first connection portion 215. The second barrier area 122 overlaps the first connection portion 215 in the fifth direction DR5. The second barrier area 122 is spaced apart from the first storage gate electrode SG1 by the gate dielectric film 135. For example, the second barrier area 122 has a higher dopant concentration of the first conductivity type than the substrate 110.

In a depth sensor according to some embodiments, at least a portion of the first storage gate electrode SG1 is disposed within the substrate 110. Therefore, in a plan view, an area of the first storage gate electrode SG1 is reduced, and a size of the pixel PX is reduced. Further, since the area of the first storage gate electrode SG1 is reduced in a plan view, an area under the first storage gate electrode SG1 onto which light is incident is reduced. Thus, a parasitic light sensitivity (PLS) of a depth sensor according to some embodiments is reduced. Further, an area of the first storage gate electrode SG1 increases due to the first and second extensions 210 and 220 within the substrate 110, as compared to a case where the first storage gate electrode SG1 is disposed on the substrate 110. Thus, a full well capacity of the first storage transistor S1 increases. For example, a charge storage capacity is increased.

As the area of the first storage gate electrode SG1 or a voltage applied to the first storage gate electrode SG1 increases, a dark component increases due to an electric field, and an electric field is concentrated on a corner of the substrate 110 between the first and second extensions 210 and 220. However, in a depth sensor according to some embodiments, the second barrier area 122 is disposed within the substrate 110 and between the first and second extensions 210 and 220, such that the dark component due to an electric field is reduced.

The gate dielectric film 135 is disposed between the first storage gate electrode SG1 and the substrate 110. The gate dielectric film 135 is disposed between the first extension 210, the second extension 220, and the first connection portion 215 and the substrate 110. The gate dielectric film 135 extends along at least a portion of the first storage gate electrode SG1. The gate dielectric film 135 extends along a periphery of each of the first extension 210 and the second extension 220 and extends along a top face of the first connection portion 215 in the fifth direction DR5. The gate dielectric film 135 exposes a bottom face 110*a* of the substrate in the fifth direction DR5 and a side face of the first connection portion 215.

The gate insulating film 137 is disposed on the first face 110*a* of the substrate 110. For example, the gate insulating film 137 covers an entire area of the first face 110*a* of the substrate 110 except for a position where the first storage gate electrode SG1 is disposed. For example, the first storage gate electrode SG1 and the gate dielectric film 135 extend through the gate insulating film 137.

The photoelectric conversion element PD is disposed within the substrate 110. The photoelectric conversion element PD has, for example, the second conductivity type. The photoelectric conversion element PD is formed by ion-implanting an n-type impurity, such as phosphorus (P) or arsenic (As), into the p-type substrate 110.

The first photo gate electrode PG1, the first tap transfer gate electrode TGX1, and the first transfer gate electrode TG1 are disposed on the first face 110*a* of the substrate 110. The first photo gate electrode PG1, the first tap transfer transistor TGX1, and the first transfer gate electrode TG1 are disposed on the gate insulating film 137. At least a portion of the first photo gate electrode PG1 overlaps the photoelectric conversion element PD in the fifth direction DR5.

The first floating diffusion area FD1 is disposed within the substrate 110. The first floating diffusion area FD1 has, for example, the second conductivity type. For example, the first floating diffusion area FD1 is formed by implanting n-type impurities into the substrate 110.

The wiring structure 190 is disposed on the gate insulating film 137. The wiring structure 190 includes a plurality of wiring that constitute the first photo gate electrode PG1, the first tap transfer gate electrode TGX1, the first storage gate electrode SG1, the first transfer gate electrode TG1, and related circuits, a plurality of contact plugs, and a plurality of interlayer insulating films.

The planarization layer 140 is disposed on the second face 110*b* of the substrate 110. The planarization layer 140 extends along the second face 110*b* of substrate 110. In an embodiment, the planarization layer 140 extends along the second face 110*b* of substrate 110 in the third direction DR3 and the fourth direction DR4. The planarization layer 140 is an anti-reflective film that prevents reflection of light incident onto the substrate 110, thereby improving a light reception ability of the photoelectric conversion element PD. Further, the planarization layer 140 is a planarization film such that the color filter 170 and the micro lens 180 described below can be formed at a uniform vertical level. The planarization layer 140 includes an insulating material. For example, the planarization layer 140 includes at least one of silicon oxide, silicon nitride, silicon oxynitride, aluminum oxide, hafnium oxide, or combinations thereof.

The color filter 170 is disposed on the planarization layer 140. The color filter 170 is positioned to correspond to each pixel PX1. For example, the color filters 170 are two-dimensionally arranged in a matrix in a plane parallel to the first direction DR1 and the second direction DR2.

The micro lens 180 is disposed on the color filter 170. The micro lens 180 is positioned to correspond to each pixel PX. The micro lens 180 covers the pixel PX. For example, the first to fourth taps TAP1, TAP2, TAP3, and TAP4 share the micro lens 180. For example, the micro lenses 180 are two-dimensionally arranged in a matrix in a plane parallel to the first direction DR1 and the second direction DR2.

The protective film 185 is disposed on the micro lens 180. The protective film 185 extends along the surface of the micro lens 180. The protective film 185 includes, for example, an inorganic oxide film.

Figure 8:
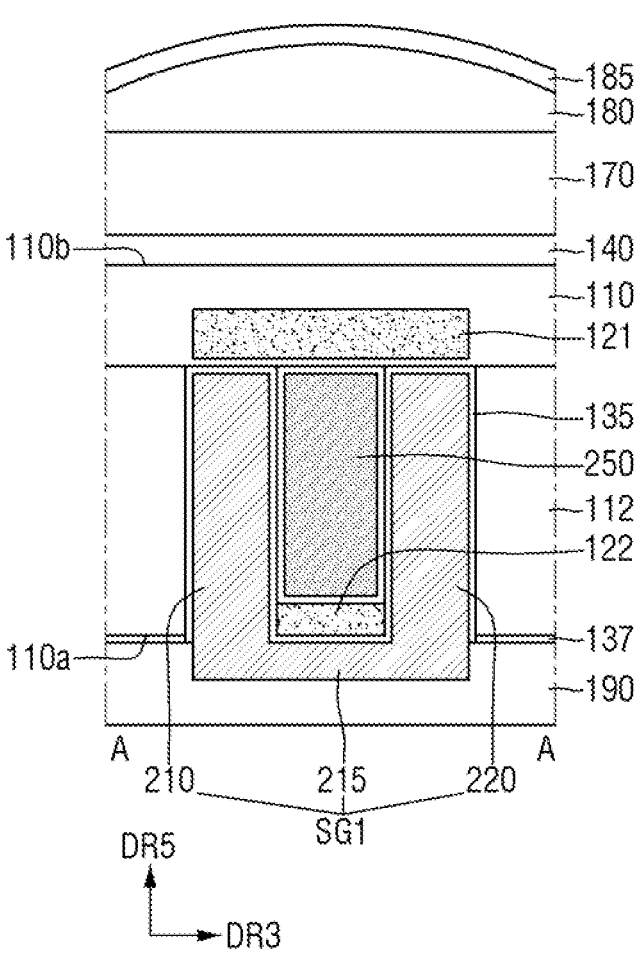
FIG. 8 to FIG. 10 are cross-sectional views of a depth sensor according to some embodiments.
Figure 9:
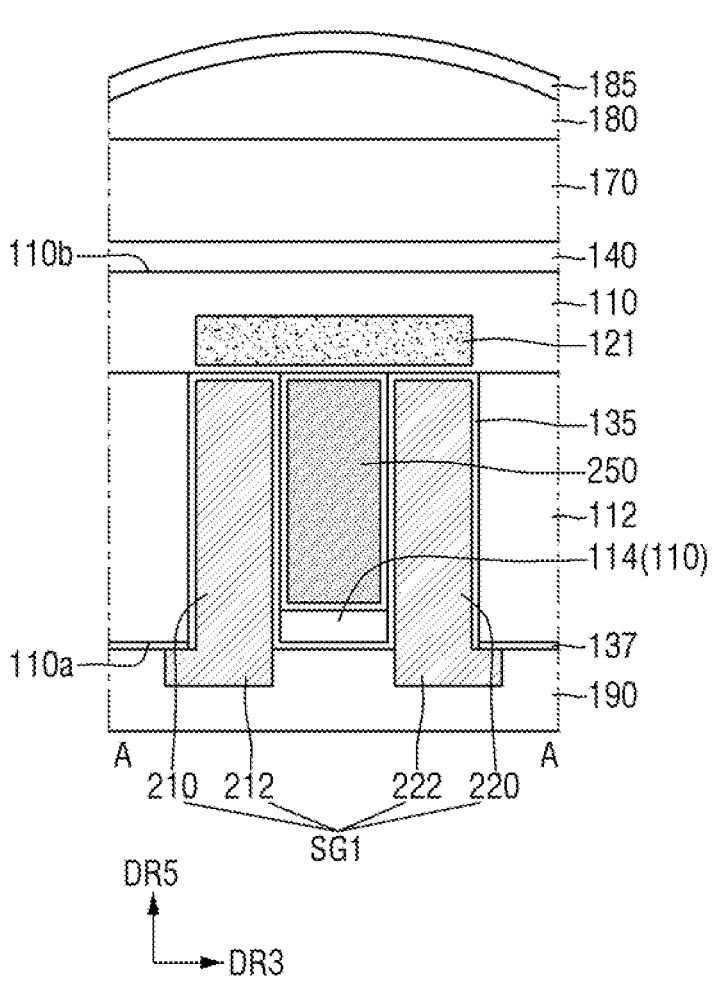
Figure 10:
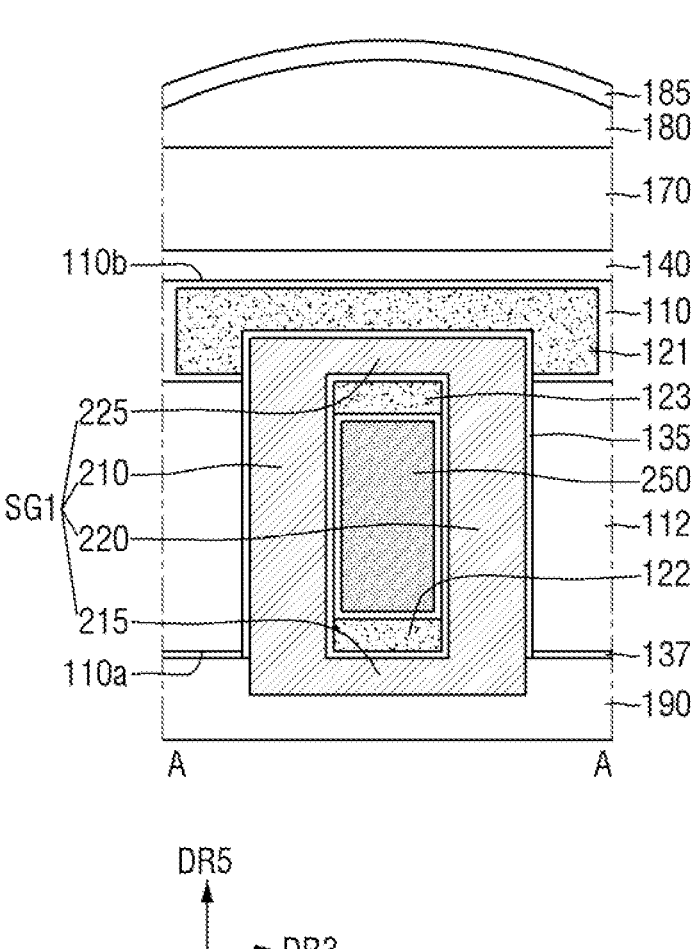

FIG. 8 to FIG. 10 are cross-sectional views of a depth sensor according to some embodiments. For reference, FIG. 8 to FIG. 10 are cross-sectional views taken along line A-A of FIG. 5. For convenience of description, the following descriptions are based on differences from the descriptions presented above with reference to FIG. 1 to FIG. 7.

Referring to FIG. 8, a depth sensor according to some embodiments further includes a storage area 250. The storage area 250 is disposed within the substrate 110. The storage area 250 is disposed on the first storage gate electrode SG1. The storage area 250 is disposed within the substrate 110 and between the first extension 210 and the second extension 220. The storage area 250 overlaps the first connection portion 215 of the first storage gate electrode SG1 in the fifth direction DR5.

The storage area 250 is disposed within the substrate 110 and between the first barrier area 121 and the second barrier area 122. The storage area 250 overlaps the first barrier area 121 and the second barrier area 122 in the fifth direction DR5. The storage area 250 has the second conductivity type.

Referring to FIG. 9, in a depth sensor according to some embodiments, the first storage gate electrode SG1 includes the first extension 210, the second extension 220, a first sub-connection portion 212, and a second sub-connection portion 222.

The first sub-connection portion 212 and the second sub-connection portion 222 are disposed on the first face 110*a* of the substrate 110. The first sub-connection portion 212 is disposed on the first extension 210, and the second sub-connection portion 222 is disposed on the second extension 220. The first sub-connection portion 212 is connected to the first extension 210 and the second sub-connection portion 222 is connected to the second extension 220. The first sub-connection portion 212 and the second sub-connection portion 222 are spaced apart from each other in the third direction DR3. The first sub-connection portion 212 and the second sub-connection portion 222 extend along the first face 110*a* of the substrate 110. For example, the first sub-connection portion 212 extends in a direction opposite to the third direction DR3, and the second sub-connection portion 222 extends in the third direction DR3. Neither of the first sub-connection portion 212 and the second sub-connection portion 222 overlaps a portion of the substrate 110 between the first extension 210 and the second extension 220 in the fifth direction DR5. A portion of the first sub-connection portion 212 and a portion of the second sub-connection portion 222 are disposed on the gate insulating film 137. A portion of each of the gate dielectric film 135 and the gate insulating film 137 disposed between the first extension 210 and the second extension 220 are exposed to the storage area 250.

The first barrier area 121 overlaps, for example, the first extension 210, the second extension 220, the first sub-connection portion 212, and the second sub-connection portion 222 in the fifth direction DR5. For example, the first barrier area 121 overlaps an entirety of the first storage gate electrode SG1 in the fifth direction DR5.

A depth sensor according to some embodiments does not include the second barrier area 122 disposed between the first extension 210 and the second extension 220. For example, only the first barrier area 121 is included in the depth sensor. Alternatively, a depth sensor according to some embodiments further includes the second barrier area 122 disposed between the first extension 210 and the second extension 220.

A depth sensor according to some embodiments includes the storage area 250 disposed between the first extension 210 and the second extension 220. Alternatively, a depth sensor according to some further embodiments does not include the storage area 250 between the first extension 210 and the second extension 220 of the first storage gate electrode SG1.

Referring to FIG. 10, in a depth sensor according to some embodiments, the first storage gate electrode SG1 includes the first extension 210, the second extension 220, the first connection portion 215, and a second connection portion 225. The first storage gate electrode SG1 has, for example, a closed circuit shape.

The second connection portion 225 is disposed within the substrate 110. The second connection portion 225 is closer to the second face 110*b* than the first face 110*a*. The second connection portion 225 connects the first extension 210 and the second extension 220 to each other while being disposed within the substrate 110. For example, the second connection portion 225 is spaced apart from the first connection portion 215 in the fifth direction DR5. The second connection portion 225 extends in, for example, the third direction DR3 in a plan view.

A third barrier area 123 is disposed within the substrate 110. The third barrier area 123 is disposed within the substrate 110 and between the first extension 210 and the second extension 220. The third barrier area 123 is adjacent to the second connection portion 225. The third barrier area 123 overlaps the second connection portion 225 in the fifth direction DR5. The third barrier area 123 is spaced apart from the first storage gate electrode SG1 by the gate dielectric film 135. The third barrier area 213 has, for example, the first conductivity type.

The gate dielectric film 135 is disposed between the second connection portion 225 and the substrate 110. The gate dielectric film 135 extends along a periphery of the second connection portion 225. The second connection portion 225 is spaced apart from the first barrier area 121 by the gate dielectric film 135.

The first barrier area 121 overlaps, for example, the first extension 210, the second extension 220, the first connection portion 215, and the second connection portion 225 in the fifth direction DR5. The first barrier area 121 overlaps, for example, an entirety of the first storage gate electrode SG1 in the fifth direction DR5. For example, the second connection portion 225 is disposed within the first barrier area 121, and the second connection portion 225 is spaced apart from the first barrier area 121 by the gate dielectric film 135. At least a portion of the second connection portion 225 overlaps the first barrier area 121 in the third direction DR3. For another example, the second connection portion 225 is spaced apart from the first barrier area 121 in the fifth direction DR5. The second connection portion 225 does not overlap the first barrier area 121 in the third direction DR3.

A depth sensor according to some embodiments includes the storage area 250 disposed between the first extension 210 and the second extension 220 and between the first connection portion 215 and the second connection portion 225. The storage area 250 is disposed between the second barrier area 122 and the third barrier area 123. Alternatively, a depth sensor according to some embodiments does not include the storage area 250 between the first extension 210 and the second extension 220 of the first storage gate electrode SG1.

Figure 11:
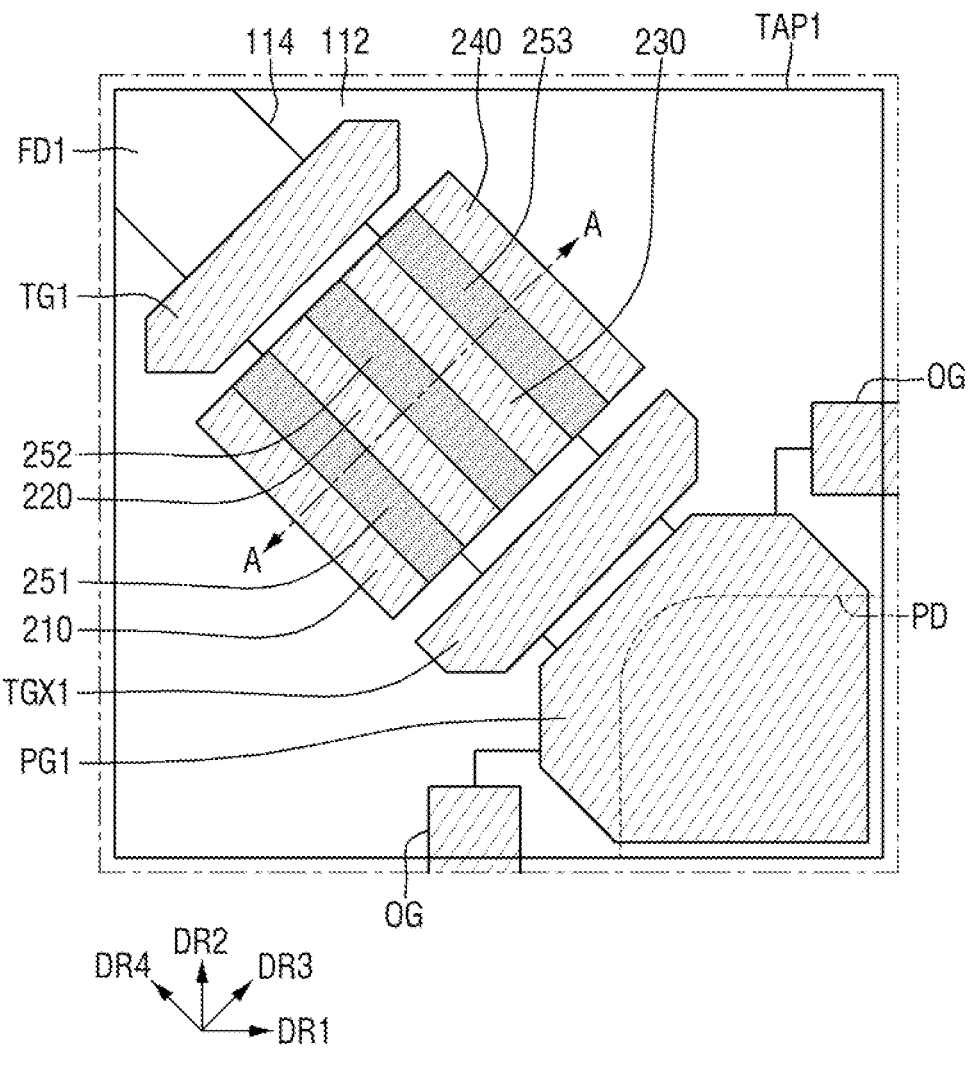
FIG. 11 illustrates a depth sensor according to some embodiments.
Figure 12:
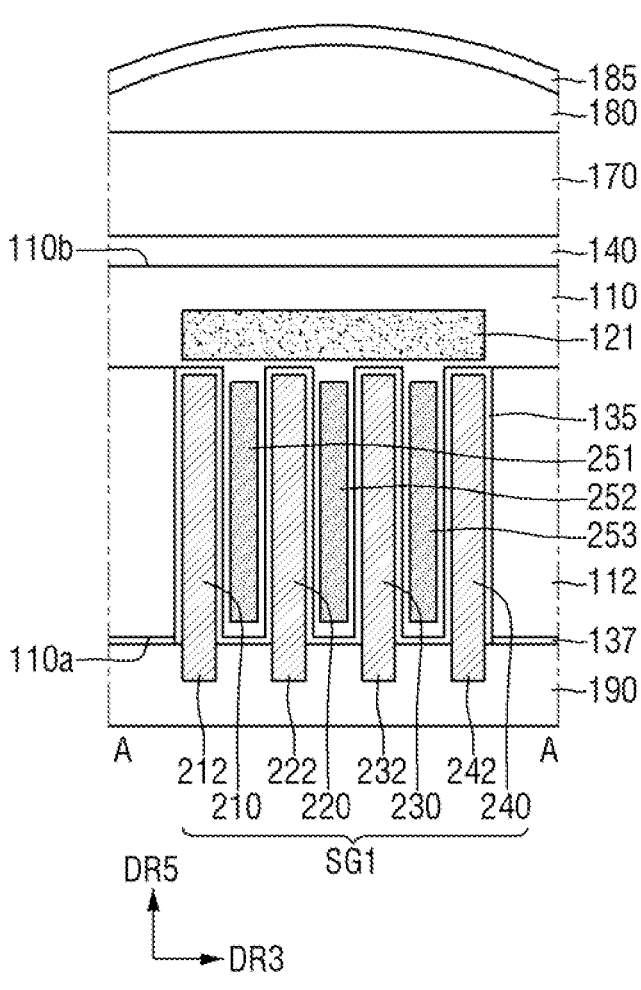
FIG. 12 is a cross-sectional view taken along line A-A in FIG. 11.

FIG. 11 illustrates a depth sensor according to some embodiments. FIG. 12 is a cross-sectional view taken along line A-A in FIG. 11. For convenience of description, the following descriptions are based on differences from the descriptions presented above with reference to FIG. 1 to FIG. 7. Hereinafter, the first tap TAP1 and the first storage gate electrode SG1 will be described by way of example. A description of each of the second to fourth taps TAP2, TAP3, and TAP4 is substantially identical to that of the first tap TAP1.

Referring to FIG. 11 and FIG. 12, in a depth sensor according to some embodiments, the first storage gate electrode SG1 includes a plurality of extensions 210, 220, 230, and 240 that extend into the substrate 110 and a plurality of sub-connection portions 212, 222, 232, and 242 respectively disposed on the plurality of extensions 210, 220, 230, and 240. For example, the first storage gate electrode SG1 includes the first to fourth extensions 210, 220, 230, and 240 and the first to fourth sub-connection portions 212, 222, 232, and 242.

The first to fourth extensions 210, 220, 230, and 240 are disposed within the substrate 110. The first to fourth extensions 210, 220, 230, and 240 extend from the first face 110*a* of the substrate 110 toward the second face 110*b*. The top faces in the fifth direction DR5 of each of the first to fourth extensions 210, 220, 230, and 240 are located within the substrate 110. The first to fourth extensions 210, 220, 230, and 240 are spaced apart from each other. The first to fourth extensions 210, 220, 230, and 240 is spaced apart from each other in, for example, the third direction DR3. The number of the extensions of the first storage gate electrode SG1 can vary.

Each of the first to fourth extensions 210, 220, 230, and 240 extends in, for example, the fourth direction DR4 in a plan view. Lengths in the fourth direction DR4 of each of the first to fourth extensions 210, 220, 230, and 240 are substantially equal to each other.

The first to fourth sub-connection portions 212, 222, 232, and 242 are disposed on the first face 110*a* of the substrate 110. The first to fourth sub-connection portions 212, 222, 232, and 242 are respectively disposed on the first to fourth extensions 210, 220, 230, and 240. The first to fourth sub-connection portions 212, 222, 232, and 242 are respectively connected to the first to fourth extensions 210, 220, 230, and 240. The first to fourth sub-connection portions 212, 222, 232, and 242 are spaced apart from each other. In a depth sensor according to some embodiments, none of the first to fourth sub-connection portion 212, 222, 232, and 242 overlaps a portion of the substrate 110 between adjacent first to fourth extensions 210, 220, 230, and 240 in the fifth direction DR5. A portion of each of the gate dielectric film 135 and the gate insulating film 137 disposed between adjacent first to fourth extensions 210, 220, 230, and 240 is exposed thereto. In a depth sensor according to some further embodiments, the first to fourth sub-connection portions 212, 222, 232, and 242 extend along the first face 110*a* of the substrate 110 and are spaced apart from each other.

The second barrier area 122 is not disposed between adjacent first to fourth extensions 210, 220, 230, and 240. For example, unlike an embodiment of FIG. 1, a depth sensor according to some embodiments includes only the first barrier area 121. The first barrier area 121 overlaps, for example, the first to fourth extensions 210, 220, 230, and 240 and the first to fourth sub-connection portions 212, 222, 232, and 242 in the fifth direction DR5. The first barrier area 121 overlaps, for example, the entirety of the first storage gate electrode SG1 in the fifth direction DR5.

A depth sensor according to some embodiments includes a plurality of storage areas 251, 252, and 253 disposed in the substrate 110 and between adjacent extensions 210, 220, 230, and 240. The plurality of storage areas 251, 252, and 253 extend in, for example, the fourth direction DR4 in a plan view. For example, the first storage area 251 is disposed within the substrate 110 and between the first extension 210 and the second extension 220. The second storage area 252 is disposed within the substrate 110 and between the second extension 220 and the third extension 230. The third storage area 253 is disposed within the substrate 110 and between the third extension 230 and the fourth extension 240.

Alternatively, a depth sensor according to some further embodiments does not include the storage areas 251, 252, and 253 disposed between adjacent extensions 210, 220, 230, and 240 of the first storage gate electrode SG1.

Figure 13:
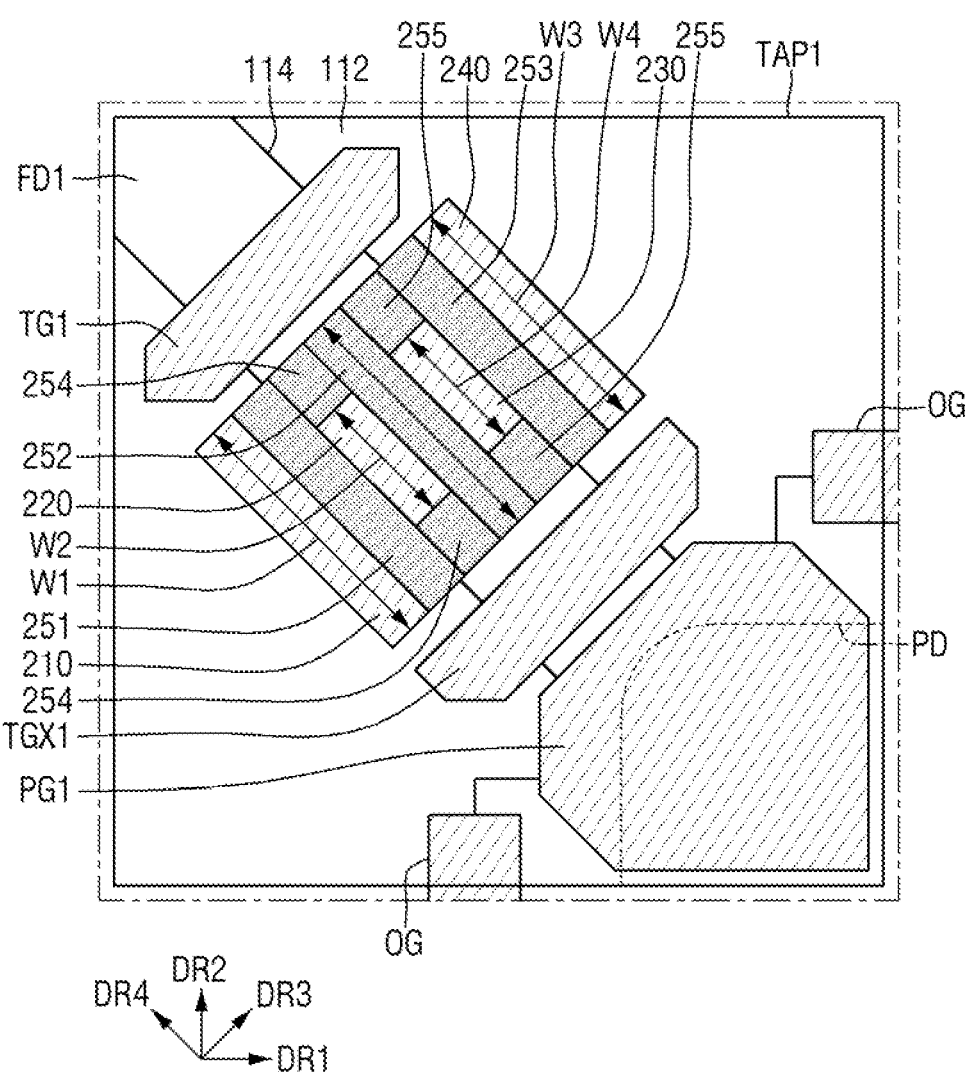
FIG. 13 illustrates a depth sensor according to some embodiments.

FIG. 13 illustrates a depth sensor according to some embodiments. For convenience of description, the following descriptions are based on differences from the descriptions presented above with reference to FIG. 11 and FIG. 12. Hereafter, the first tap TAP1 and the first storage gate electrode SG1 are described by way of example. A description of each of the second to fourth taps TAP2, TAP3, and TAP4 is substantially identical to that of the first tap TAP1.

Referring to FIG. 13, in a depth sensor according to some embodiments, the first storage gate electrode SG1 includes the extensions 210, 220, 230, and 240 that have different lengths in the fourth direction DR4. For example, the lengths W1 and W3 in the fourth direction DR4 of each the first and fourth extensions 210 and 240 disposed in an outer area of the first storage gate electrode SG1 are longer than the lengths W2 and W4 in the fourth direction DR4 of each of the second and third extensions 220 and 230 disposed in an inner area of the first storage gate electrode SG1. The length W1 in the fourth direction DR4 of the first extension 210 and the length W3 in the fourth direction DR4 of the fourth extension 240 may be the same as or different from each other. The length W2 in the fourth direction DR4 of the second extension 220 and the length W4 in the fourth direction DR4 of the third extension 230 may be the same as or different from each other.

Storage areas 254 and 255 are further disposed on a portion of the active area 114 where the second extension 220 and the third extension 230 are not disposed. For example, the fourth storage area 254 is disposed on a portion of the active area 114 between the first storage area 251 and the second storage area 252. The fifth storage area 255 is disposed on a portion of the active area 114 between the second storage area 252 and the third storage area 253. The first to fifth storage areas 251, 252, 253, 254, and 255 are spaced apart from each other and connected to each other. Accordingly, a total area of the storage areas 251, 252, 253, 254, and 255 increases in a depth sensor according to some embodiments.

Figure 14:
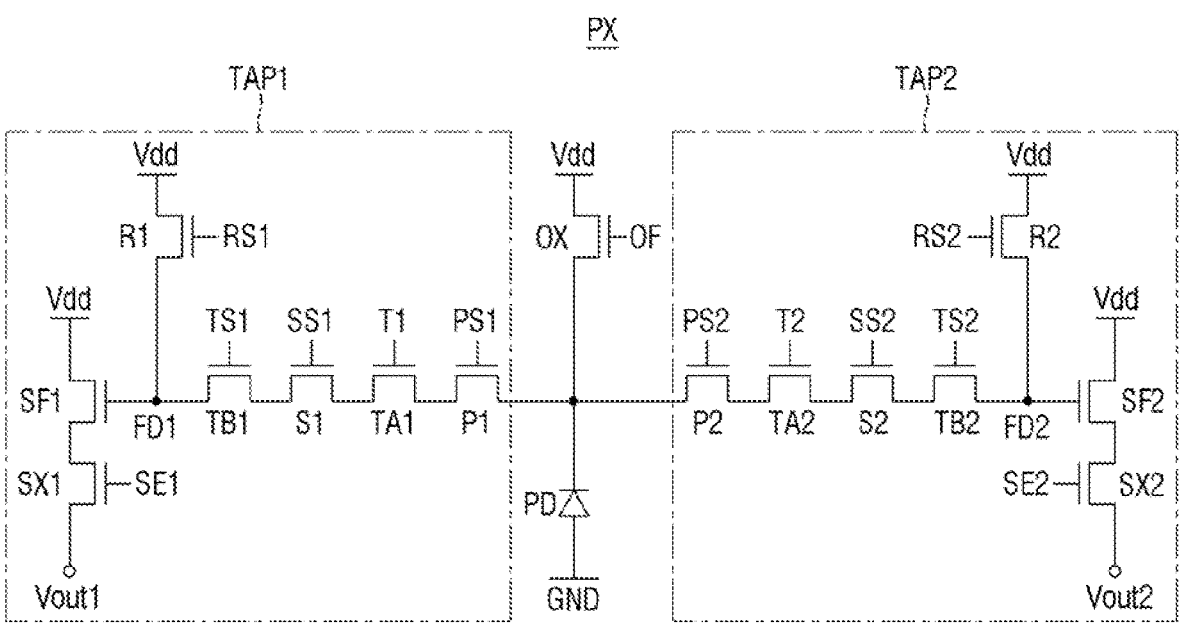
FIG. 14 is a circuit diagram of a pixel according to some embodiments.

FIG. 14 is a circuit diagram of a pixel according to some embodiments. For convenience of description, the following descriptions are based on differences from the descriptions presented above with reference to FIG. 1 to FIG. 13.

Referring to FIG. 14, in an embodiment, the pixel PX has a 2-tap structure. The pixel PX includes the photoelectric conversion element PD, the first tap TAP1, the second tap TAP2, and the overflow transistor OX. The first tap TAP1 and the second tap TAP2 are connected to one photoelectric conversion element PD. The first tap TAP1 and the second tap TAP2 share the photoelectric conversion element PD. The first storage gate electrode SG1 of the first tap TAP1 of the first storage transistor S1 and the second storage gate electrode SG2 of the second storage transistor S2 of the second tap TAP2 each have the same structure as those of the first storage gate electrode SG1 as described with reference to FIG. 1 to FIG. 13.

Figure 15:
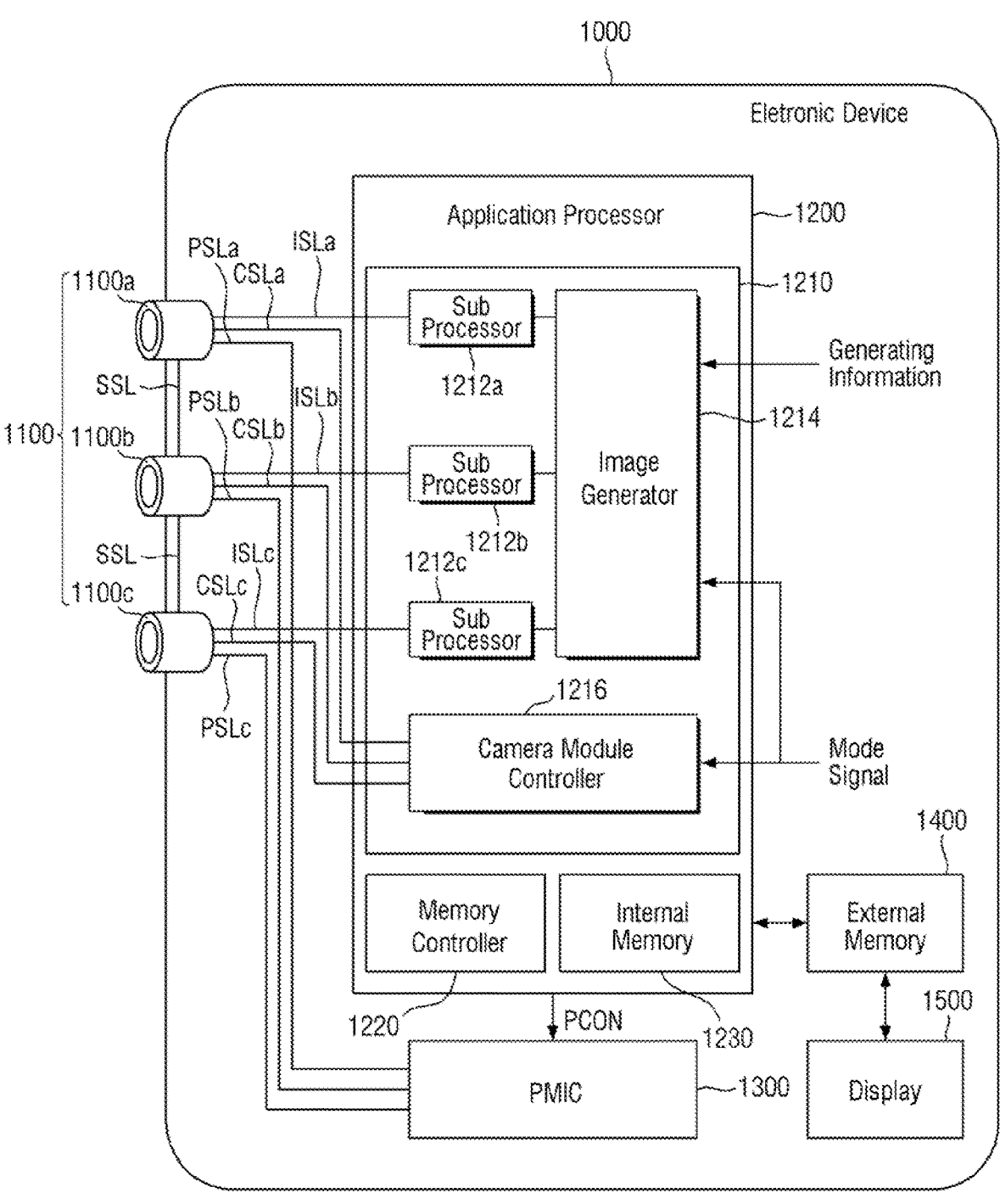
FIG. 15 is a block diagram of an electronic device that includes multiple camera modules.
Figure 16:
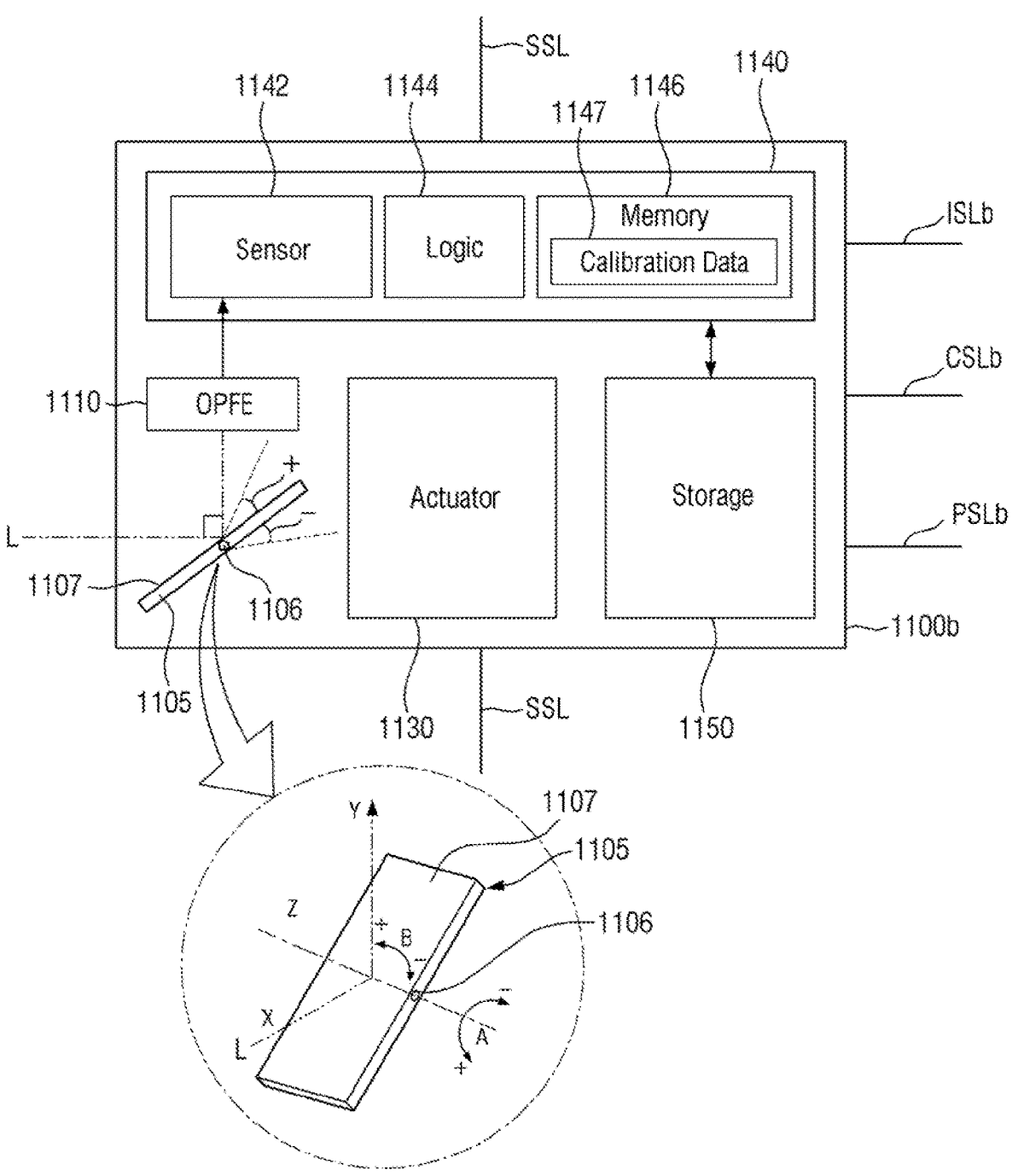
FIG. 16 is a block diagram of a camera module in FIG. 15.

FIG. 15 is a block diagram of an electronic device that includes multiple camera modules according to some embodiments of the present disclosure. FIG. 16 is a block diagram of a camera module of FIG. 15.

Referring to FIG. 15, in an embodiment, an electronic device 1000 includes a camera module group 1100, an application processor 1200, a PMIC (power management integrated circuit) 1300, an external memory 1400, and a display monitor 1500.

The camera module group 1100 includes a plurality of camera modules 1100a, 1100b, and 1100c. One of the plurality of camera modules 1100a, 1100b, and 1100c is a depth sensor as described with reference to FIG. 1 to FIG. 14. Although FIG. 15 shows an embodiment in which three camera modules 1100a, 1100b, and 1100c are arranged, embodiments are not necessarily limited thereto. In some embodiments, the camera module group 1100 includes only two camera modules. Further, in some embodiments, the camera module group 1100 includes n camera modules, where n is a positive integer of 4 or greater.

Hereinafter, with reference to FIG. 16, a detailed configuration of the camera module 1100b will be described. However, the following description may be equally applied to other camera modules 1100a and 1100c, according to embodiments.

Referring to FIG. 16, the camera module 1100b includes a prism 1105, an optical path folding element (OPFE) 1110, an actuator 1130, an image sensing device 1140, and storage 1150.

The prism 1105 includes a reflective face 1107 made of a reflective material, and thus modifies a path of externally incident light L.

In some embodiments, the prism 1105 changes the path of the light L such that the light incident thereto in the first direction X is output therefrom in a second direction Y perpendicular to the first direction X. Further, the prism 1105 may rotate the reflective face 1107 of the reflective material in an A direction about a central axis 1106 or may rotate the central axis 1106 in a B direction so that the light incident thereto in the first direction X is output therefrom in the second direction Y perpendicular to the first direction X. In this connection, the OPFE 1110 moves in a third direction Z normal to a plane defined by the first direction X and the second direction Y.

In some embodiments, as shown, a maximum rotation angle in the A direction of the prism 1105 is less than or equal to 15 degrees in a plus (+) A direction, and is greater than 15 degrees in a minus (−) A direction. However, embodiments of the present disclosure are not necessarily limited thereto.

In some embodiments, the prism 1105 rotates in a range of about 20 degrees, or between 10 and 20 degrees, or between 15 and 20 degrees in the plus (+) or minus (−) B direction. In this regard, the prism 1105 rotates by the same angle in the plus (+) and minus (−) B directions. Alternatively, in some embodiments, angles by which the prism 1105 rotates in the plus (+) and minus (−) B directions, respectively, have a difference of about 1 degree therebetween.

In some embodiments, the prism 1105 moves the reflective face 1107 in the third direction, such as the Z direction parallel to an extension direction of the center axis 1106.

The OPFE 1110 includes a group of m optical lens, where m is a positive integer. The group of m optical lenses move in the second direction Y to change a optical zoom ratio of the camera module 1100b. For example, a basic optical zoom ratio of the camera module 1100b is Z. When the m optical lenses in the OPFE 1110 move, the optical zoom ratio of the camera module 1100*b* changes to an optical zoom ratio equal to or greater than 3Z or 5Z.

The actuator 1130 moves the OPFE 1110 or the optical lens to a specific position. For example, the actuator 1130 adjusts a position of the optical lens so that an image sensor 1142 is located at a focal length of the optical lens for accurate sensing.

The image sensing device 1140 includes the image sensor 1142, a control logic 1144 and a memory 1146. The image sensor 1142 senses an image of a sensing target using the light L received through the optical lens. The control logic 1144 controls all operations of the camera module 1100*b*. For example, the control logic 1144 controls an operation of the camera module 1100*b* based on a control signal received through a control signal line CSLb.

The memory 1146 stores information for the operation of the camera module 1100*b*, such as calibration data 1147. The calibration data 1147 includes information needed when the camera module 1100*b* generates image data using the light L. The calibration data 1147 includes, for example, information about a degree of rotation, information about a focal length, information about an optical axis, etc., as described above. When the camera module 1100*b* is implemented as a multi-state camera in which the focal length varies based on a position of the optical lens, the calibration data 1147 includes a focal length value based on each position (or each state) of the optical lens, and information related to auto focusing.

The storage 1150 stores image data sensed by the image sensor 1142. The storage 1150 is disposed outside the image sensing device 1140, and is stacked on a sensor chip that constitutes the image sensing device 1140. In some embodiments, the storage 1150 is embodied as an EEPROM (Electrically Erasable Programmable Read-Only Memory). However, embodiments of the present disclosure are not necessarily limited thereto.

Referring to FIG. 15 and FIG. 16 together, in some embodiments, each of the plurality of camera modules 1100*a*, 1100*b*, and 1100*c* include the actuator 1130. Accordingly, each of the plurality of camera modules 1100*a*, 1100*b*, and 1100*c* includes the same or different calibration data 1147 based on an operation of the actuator 1130 included therein.

In some embodiments, one of the plurality of camera modules 1100*a*, 1100*b*, and 1100*c*, such as 1100*b*, is has a folded lens form that includes the prism 1105 and the OPFE 1110 as described above, while each of the remaining camera modules, such as 1100*a* and 1100*c*, is a vertical-type camera module that does not include the prism 1105 and the OPFE 1110. However, embodiments are not necessarily limited thereto.

In some implementation, one of the plurality of camera modules 1100*a*, 1100*b*, and 1100*c*, such as 1100*c*, is a vertical form depth camera that extracts depth information by using, for example, IR (infrared light). For example, the application processor 1200 merges image data received from the depth camera and image data received from another camera module, such as 1100*a* or 1100*b*, to generate a three-dimensional (3D) depth image.

In some embodiments, at least two of the plurality of camera modules 1100*a*, 1100*b*, and 1100*c*, such as 1100*a* and 1100*b*, have different FOVs (Field of Views). For example, optical lenses of at least two of the plurality of camera modules 1100*a*, 1100*b*, and 1100*c*, such as 1100*a* and 1100*b*, differ from each other. However, embodiments of the present disclosure are not necessarily limited thereto.

Further, in some embodiments, FOVs of each of the plurality of camera modules 1100*a*, 1100*b*, and 1100*c* differ from each other. For example, the optical lenses in each of the plurality of camera modules 1100*a*, 1100*b*, and 1100*c* also differ from each other. However, embodiments of the present disclosure are not necessarily limited thereto.

In some embodiments, the plurality of camera modules 1100*a*, 1100*b*, and 1100*c* are physically separated from each other. For example, instead of a scheme in which a sensing area of one image sensor 1142 is divided into a plurality of sub-areas that respectively correspond to the plurality of camera modules 1100*a*, 1100*b*, and 1100*c*, a scheme in which an individual image sensor 1142 is disposed in each of the plurality of camera modules 1100*a*, 1100*b*, and 1100*c* is used.

Referring back to FIG. 15, in an embodiment, the application processor 1200 include an image processing device 1210, a memory controller 1220, and an internal memory 1230. The application processor 1200 is separated from the plurality of camera modules 1100*a*, 1100*b*, and 1100*c*. For example, the application processor 1200 and the plurality of camera modules 1100*a*, 1100*b*, and 1100*c* are implemented as separate semiconductor chips that are separated from each other.

The image processing device 1210 includes a plurality of auxiliary image processors 1212*a*, 1212*b*, and 1212*c*, an image generator 1214 and a camera module controller 1216.

The number of the auxiliary image processors 1212*a*, 1212*b*, and 1212*c* correspond to the number of camera modules 1100*a*, 1100*b*, and 1100*c*.

Image data generated from each of the camera modules 1100*a*, 1100*b*, and 1100*c* is provided to each of the auxiliary image processors 1212*a*, 1212*b*, and 1212*c* by separate image signal lines ISLa, ISLb, and ISLc, respectively. For example, the image data generated from the camera module 1100*a* is transmitted to the auxiliary image processor 1212*a* through the image signal line ISLa. The image data generated from the camera module 1100*b* is transmitted to the auxiliary image processor 1212*b* through the image signal line ISLb. The image data generated from the camera module 1100*c* is transmitted to the auxiliary image processor 1212*c* through the image signal line ISLc. The image data transmission is performed by using, for example, a camera serial interface (CSI) based on a MIPI (Mobile Industry Processor Interface). However, embodiments of the present disclosure are not necessarily limited thereto.

In some embodiments, one auxiliary image processor corresponds to a plurality of camera modules. For example, the auxiliary image processor 1212*a* and the auxiliary image processor 1212*c* are not implemented separately from each other as shown, but are integrated into one auxiliary image processor. The image data provided from the camera module 1100*a* and the camera module 1100*c* can be selected by a selection element, such as a multiplexer, and then be provided to the integrated auxiliary image processor.

The image data provided to each of the auxiliary image processors 1212*a*, 1212*b*, and 1212*c* is provided to the image generator 1214. The image generator 1214 generates an output image using the image data received from each of the auxiliary image processors 1212*a*, 1212*b*, and 1212*c* and image generation information or a mode signal.

In an embodiment, the image generator 1214 merges at least a portion of the image data received from camera modules 1100*a*, 1100*b*, and 1100*c* that have different FOVs, based on the image generation information or the mode signal, and generates the output image as the merging result. In an embodiment, the image generator 1214 selects one set of image data received from camera modules 1100a, 1100b, and 1100c that have different FOVs, based on the image generation information or the mode signal, and generates the output image as the selected data.

In some embodiments, the image generation information includes a zoom signal or a zoom factor. Further, in some embodiments, the mode signal is, for example, a signal based on a user selected mode.

When the image generation information includes a zoom signal or a zoom factor, and the camera modules 1100a, 1100b, and 1100c have different FOVs, the image generator 1214 performs different operations based on the zoom signal. For example, when the zoom signal is a first signal, the image generator merges the image data received from the camera module 1100a and the image data received from the camera module 1100c with each other, and generates the output image using the merged image data. The image data received from the camera module 1100b is not used in this merging operation. When the zoom signal is a second signal different from the first signal, the image generator 1214 does not perform an image data merging operation, but selects one set of image data received from the camera modules 1100a, 1100b, and 1100c and generates the selected data as the output image. However, embodiments are not necessarily limited thereto. An embodiment for processing the image data can be modified as needed.

In some embodiments, the image generator 1214 receives a plurality of image data that have different exposure times from at least one of the plurality of auxiliary image processors 1212a, 1212b, and 1212c, and performs HDR (high dynamic range) processing on the received plurality of image data, thereby generating merged image data having an increased dynamic range.

The camera module controller 1216 provides a control signal to each of the camera modules 1100a, 1100b, and 1100c. The control signal received from the camera module controller 1216 is provided to a corresponding camera module 1100a, 1100b, or 1100c through a corresponding control signal line CSLa, CSLb, or CSLc that are separated from each other.

In an embodiment, one of the plurality of camera modules 1100a, 1100b, or 1100c, such as 1100b, is designated as a master camera based on the image generation information that includes the zoom signal or the mode signal, while each of the remaining camera modules, such as 1100a and 1100c, is designated as a servant camera. This designation information is included in the control signal and is provided to the corresponding camera module 1100a, 1100b, or 1100c through a corresponding control signal line CSLa, CSLb, or CSLc.

The camera module that acts as the master or servant camera can vary based on the zoom factor or an operation mode signal. For example, when the FOV of the camera module 1100a is greater than that of the camera module 1100b, and the zoom factor indicates a low zoom ratio, the camera module 1100b acts as a master camera, while the camera module 1100a acts as a servant camera. Conversely, when the zoom factor indicates a high zoom ratio, the camera module 1100a acts as a master camera, while the camera module 1100b acts as a servant camera.

In some embodiments, the control signal from the camera module controller 1216 provided to each of the camera modules 1100a, 1100b, and 1100c includes a sync enable signal. For example, when the camera module 1100b is the master camera, and each of the camera modules 1100a and 1100c is a servant camera, the camera module controller 1216 transmits the sync enable signal to the camera module

1100b. Upon receiving a sync enable signal, the camera module 1100b generates a sync signal based on the provided sync enable signal, and provides the generated sync signal to the camera modules 1100a and 1100c through a sync signal line SSL. The camera module 1100b and the camera modules 1100a and 1100c transmit the image data to the application processor 1200 while the camera module 1100b and the camera modules 1100a and 1100c are synchronized with each other using the sync signal.

In some embodiments, the control signal from the camera module controller 1216 provided to each of the plurality of camera modules 1100a, 1100b, and 1100c includes mode information according to the mode signal. Based on this mode information, the plurality of camera modules 1100a, 1100b, and 1100c operate in a first operation mode or a second operation mode in relation to a sensing speed.

In a first operation mode, the plurality of camera modules 1100a, 1100b, and 1100c generate an image signal at a first speed, such as a first frame rate, encode the image signal at a second speed higher than the first speed, such as a second frame rate higher than the first frame rate, and transmit the encoded image signal to the application processor 1200. For example, the second speed is less than or equal to 30 times of the first speed.

The application processor 1200 store the received image signal, that is, the encoded image signal, in the internal memory 1230 or the external memory 1400, and then reads and decodes the encoded image signal from the internal memory 1230 or the external memory 1400, and then displays image data generated from the decoded image signal on the display monitor 1500. For example, a corresponding auxiliary processor of the plurality of auxiliary processors 1212a, 1212b, and 1212c of the image processing device 1210 decodes the image signal, and performs image processing on the decoded image signal.

In a second operation mode, the plurality of camera modules 1100a, 1100b, and 1100c generate an image signal at a third speed lower than the first speed, such as a third frame rate lower than the first frame rate, and then transmit the image signal to the application processor 1200. The image signal transmitted to the application processor 1200 is an unencoded signal. The application processor 1200 performs image processing on the received image signal or stores the image signal in the internal memory 1230 or the external memory 1400.

The PMIC 1300 supplies power, such as a power supply voltage, to each of the plurality of camera modules 1100a, 1100b, and 1100c. For example, the PMIC 1300 supplies first power to the camera module 1100a through a first power signal line PSLa, supplies second power to the camera module 1100b through a second power signal line PSLb, and supplies third power to the camera module 1100c through a third power signal line PSLc, under control of the application processor 1200.

The PMIC 1300 generates power that corresponds to each of the plurality of camera modules 1100a, 1100b, and 1100c and adjusts a power level, in response to a power control signal t received from the application processor 1200. The power control signal PCON includes an operation mode-based power adjustment signal for the plurality of camera modules 1100a, 1100b, and 1100c. For example, the operation mode includes a low power mode. For example, the power control signal PCON includes information about a camera module that operates in the low power mode and information about a set power level. Power levels respectively provided to the plurality of camera modules 1100a, 1100*b*, and 1100*c* may be the same as or different from each other. Further, the power levels may vary dynamically.

Although embodiments of the present disclosure have been described in detail with reference to the accompanying drawings, embodiments of the present disclosure are not necessarily limited thereto. Embodiments of the present disclosure may take various forms within the scope while not departing from the technical idea of embodiments of the present disclosure. Accordingly, embodiments disclosed in the present disclosure are not intended to limit the technical idea of the present disclosure, but to describe the present disclosure. The scope of the technical idea of embodiments of the present disclosure is not limited by the embodiments. Therefore, it should be understood that embodiments as described above are illustrative and non-limiting in all respects. The scope of protection of embodiments of the present disclosure should be interpreted by the claims, and all technical ideas within the scope of embodiments of the present disclosure should be interpreted as being included in the scope of embodiments of the present disclosure.

What is claimed is:

1. A depth sensor, comprising:
a substrate that includes a first face and a second face that are opposite to each other in a first direction;
a photoelectric conversion element disposed in the substrate; and
first and second taps connected to the photoelectric conversion element,
wherein each of the first and second taps includes:
a floating diffusion area disposed in the substrate;
a transfer transistor connected to the floating diffusion area;
a photo transistor connected to the photoelectric conversion element;
a tap transfer transistor connected to the photo transistor; and
a storage transistor connected to the tap transfer transistor and the transfer transistor,
wherein the storage transistor includes a storage gate electrode,
wherein the storage gate electrode includes a first extension and a second extension that extend from the first face of the substrate toward the second face thereof, wherein the first extension and the second extension are spaced apart from each other in a second direction that differs from the first direction.

2. The depth sensor of claim 1, further comprising a first barrier area disposed in the substrate and between the first extension and the second extension,
wherein the storage gate electrode further includes a first connection portion that connects the first extension and the second extension to each other, wherein the first connection portion is disposed on the first face of the substrate and is adjacent to the first barrier area.

3. The depth sensor of claim 2, further comprising a second barrier area disposed in the substrate and between the first extension and the second extension,
wherein the storage gate electrode further includes a second connection portion that connects the first extension and the second extension to each other, wherein the second connection portion is disposed in the substrate and is adjacent to the second barrier area.

4. The depth sensor of claim 1, further comprising a storage area disposed in the substrate and between the first extension and the second extension.

5. The depth sensor of claim 1, wherein the storage gate electrode further includes:

a first connection portion disposed on the first face of the substrate and that is connected to the first extension; and
a second connection portion disposed on the first face of the substrate and that is connected to the second extension, wherein the second connection portion is spaced apart from the first connection portion in the second direction.

6. The depth sensor of claim 1, wherein the storage gate electrode further includes a third extension that extends from the first face toward the second face, wherein the third extension is spaced apart from the second extension,
wherein the second extension is disposed between the first extension and the third extension.

7. The depth sensor of claim 6, wherein each of the first extension and the second extension is disposed in the substrate and extends in a third direction that differs from the first direction,
wherein a length in the third direction of the second extension is less than a length in the third direction of each of the first extension and the third extension.

8. The depth sensor of claim 6, wherein each of the first extension and the second extension is disposed in the substrate and extends in a third direction that differs from the first direction,
wherein a length in the second direction of the second extension is equal to a length in the second direction of each of the first extension and the third extension.

9. The depth sensor of claim 6, further comprising:
a first storage area disposed in the substrate and between the first extension and the second extension; and
a second storage area disposed in the substrate and between the second extension and the third extension.

10. The depth sensor of claim 1, further comprising a barrier area disposed in the substrate,
wherein the barrier area overlaps each of the first extension and the second extension in the first direction.

11. A depth sensor, comprising:
a substrate; and
a plurality of pixels disposed on the substrate,
wherein each of the plurality of pixels includes:
a photoelectric conversion element;
a first photo transistor connected to the photoelectric conversion element by a first photo gate signal;
a second photo transistor connected to the photoelectric conversion element by a second photo gate signal;
a first floating diffusion area;
a second floating diffusion area;
a first storage transistor that connects the first photo transistor and the first floating diffusion area to each other; and
a second storage transistor that connects the second photo transistor and the second floating diffusion area to each other,
wherein the second photo gate signal has a phase that differs from a phase of the first photo gate signal,
wherein each of the first and second storage transistors includes a storage gate electrode, wherein the storage gate electrode includes a first extension and a second extension that are disposed in the substrate and that are spaced apart from each other.

12. The depth sensor of claim 11, wherein each of the plurality of pixels further includes:
a third photo transistor connected to the photoelectric conversion element by a third photo gate signal; and
a fourth photo transistor connected to the photoelectric conversion element by a fourth photo gate signal, wherein the first to fourth photo gate signals have phases that differ from each other, wherein each of the third and fourth photo transistors includes a storage gate electrode, wherein the storage gate electrode includes a first extension and a second extension that are disposed in the substrate and that are spaced apart from each other.

13. The depth sensor of claim 12, further comprising a plurality of micro lenses that respectively correspond to the plurality of pixels, wherein the plurality of micro lenses are disposed on the substrate.

14. The depth sensor of claim 12, wherein the storage gate electrode further includes:

a first connection portion disposed on the substrate and that is connected to the first extension; and a second connection portion disposed on the substrate and that is connected to the second extension.

15. The depth sensor of claim 12, further comprising a first barrier area disposed in the substrate and between the first extension and the second extension, wherein the storage gate electrode further includes a first connection portion disposed on the substrate and connected to the first extension and the second extension, wherein the first connection portion is adjacent to the first barrier area.

16. The depth sensor of claim 15, further comprising a second barrier area disposed in the substrate and between the first extension and the second extension, wherein the storage gate electrode further includes a second connection portion disposed in the substrate and connected to the first extension and the second extension, wherein the second connection portion is adjacent to the second barrier area.

17. The depth sensor of claim 12, further comprising a storage area disposed in the substrate and between the first extension and the second extension.

18. The depth sensor of claim 12, wherein the storage gate electrode further includes a third extension disposed in the substrate, wherein the first to third extensions are sequentially arranged along a first direction.

19. The depth sensor of claim 18, wherein a length in a second direction of the second extension differs from a length in the second direction of each of the first extension and the third extension, wherein the second direction differs from the first direction.

20. A depth sensor, comprising:

a substrate that includes a first face and a second face that are opposite to each other in a first direction; and a plurality of pixels disposed on the substrate, wherein each of the plurality of pixels includes:

a photoelectric conversion element disposed in the substrate; and first and second taps that share the photoelectric conversion element, wherein each of the first and second taps includes:

a floating diffusion area disposed in the substrate;

a transfer transistor connected to the floating diffusion area;

a photo transistor connected to the photoelectric conversion element;

a tap transfer transistor connected to the photo transistor;

a storage transistor connected to the tap transfer transistor and the transfer transistor; and a barrier area disposed in the substrate and that overlaps the storage transistor in the first direction, wherein a first photo gate signal applied to the photo transistor of the first tap and a second photo gate signal applied to the photo transistor of the second tap have phases that differ from each other, wherein the storage transistor includes a storage gate electrode that includes a first extension and a second extension, wherein the first extension and the second extension extend from the first face of the substrate toward the second face thereof and are spaced apart from each other in a second direction that differs from the first direction.

*   *   *   *   *